(12) United States Patent
Kwon et al.

(10) Patent No.: US 9,570,200 B2
(45) Date of Patent: Feb. 14, 2017

(54) RESISTIVE MEMORY DEVICE HAVING MEMORY CELL ARRAYS WITH MULTIPLE STACK LAYERS AND BAD-REGION MANAGING CIRCUIT AND METHOD FOR MANAGING SHORT FAILURE

(71) Applicant: SAMSUNG ELECTRONICS CO., LTD., Suwon-si, Gyeonggi-Do (KR)

(72) Inventors: Hyo-Jin Kwon, Seoul (KR); Dae-Seok Byeon, Seongnam-si (KR); Yeong-Taek Lee, Seoul (KR); Chi-Weon Yoon, Seoul (KR); Yong-Kyu Lee, Hwaseong-si (KR); Hyun-Kook Park, Anyang-si (KP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/743,521

(22) Filed: Jun. 18, 2015

(65) Prior Publication Data
US 2016/0042811 A1    Feb. 11, 2016

(30) Foreign Application Priority Data

Aug. 5, 2014    (KR) .................. 10-2014-0100660

(51) Int. Cl.
| | |
|---|---|
| *G11C 7/00* | (2006.01) |
| *G11C 29/00* | (2006.01) |
| *G11C 13/00* | (2006.01) |
| *G11C 11/16* | (2006.01) |
| *G11C 29/44* | (2006.01) |

(52) U.S. Cl.
CPC .............. *G11C 29/76* (2013.01); *G11C 11/16* (2013.01); *G11C 11/1653* (2013.01); *G11C 11/1675* (2013.01); *G11C 11/1677* (2013.01); *G11C 11/1695* (2013.01); *G11C 13/0002* (2013.01); *G11C 13/0023* (2013.01); *G11C 13/0059* (2013.01); *G11C 13/0064* (2013.01); *G11C 13/0069* (2013.01); *G11C 29/808* (2013.01); *G11C 2029/4402* (2013.01); *G11C 2213/71* (2013.01)

(58) Field of Classification Search
CPC .......................... G11C 29/808; G11C 29/785
USPC ............................... 365/148, 51, 200
See application file for complete search history.

(56) References Cited

U.S. PATENT DOCUMENTS

| | | | |
|---|---|---|---|
| 7,106,639 | B2 | 9/2006 | Taussig et al. |
| 7,570,511 | B2 | 8/2009 | Cho et al. |
| 7,889,538 | B2 | 2/2011 | Toda |
| 7,924,639 | B2 | 4/2011 | Park et al. |
| 8,279,655 | B2 | 10/2012 | Kanno et al. |
| 8,644,072 | B2 | 2/2014 | Nagashima |
| 2008/0056041 | A1 | 3/2008 | Liaw et al. |
| 2011/0007588 | A1* | 1/2011 | Li .................. G11C 5/02 365/200 |

(Continued)

*Primary Examiner* — Connie Yoha
(74) *Attorney, Agent, or Firm* — Volentine & Whitt, PLLC

(57) ABSTRACT

A resistive memory device includes a memory cell array that includes a plurality of memory layers stacked in a vertical direction. Each of the plurality of memory layers includes a plurality of memory cells disposed in regions where a plurality of first lines and a plurality of second lines cross each other. A bad region management unit defines as a bad region a first memory layer including a bad cell from among the plurality of memory cells and at least one second memory layer.

22 Claims, 28 Drawing Sheets

(56) References Cited

U.S. PATENT DOCUMENTS

| | | | |
|---|---|---|---|
| 2011/0228581 A1* | 9/2011 | Park | G11C 5/025 |
| | | | 365/51 |
| 2012/0254680 A1* | 10/2012 | Oh | G06F 11/1068 |
| | | | 714/723 |
| 2013/0208529 A1 | 8/2013 | Tomotani et al. | |
| 2013/0286711 A1 | 10/2013 | Lung | |
| 2014/0050003 A1 | 2/2014 | Tomotani et al. | |
| 2015/0199267 A1* | 7/2015 | Oh | G06F 3/0619 |
| | | | 714/766 |
| 2016/0124810 A1* | 5/2016 | Yang | G06F 11/1072 |
| | | | 714/764 |

* cited by examiner

Bad region map table

| Bad Region Layer | Replaced Layer |
|---|---|
| ML2 | MLi+1 |
| ML3 | MLi+2 |
| ML4 | MLi+3 |

32

RESISTIVE MEMORY DEVICE HAVING MEMORY CELL ARRAYS WITH MULTIPLE STACK LAYERS AND BAD-REGION MANAGING CIRCUIT AND METHOD FOR MANAGING SHORT FAILURE

CROSS-REFERENCE TO RELATED APPLICATION

This application claims the benefit of Korean Patent Application No. 10-2014-0100660, filed on Aug. 5, 2014, in the Korean Intellectual Property Office, the disclosure of which is incorporated herein in its entirety by reference.

BACKGROUND

The application relates to a memory device, and more particularly, to a resistive memory device and an operating method of the resistive memory device.

According to the demand for high capacity and low power consumption of a memory device, research in next-generation memory devices that are non-volatile and do not require a refresh operation is being conducted. The next-generation memory devices are required to have a high integrity characteristic of Dynamic Random Access Memory (DRAM), a non-volatile characteristic of flash memory, and a high speed of static RAM (SRAM). As the next-generation memory devices, Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) are highlighted.

SUMMARY

The application discloses a resistive memory device that prevents excess leakage current flowing through a memory cell array in which memory layers are stacked in a vertical direction.

The application also discloses an operating method of a resistive memory device including a memory cell array in which memory layers are stacked, wherein by using the method, a memory cell having a short failure is effectively managed.

The application also discloses an operating method of a resistive memory device including a memory cell array in which memory layers are stacked, wherein by using the operating method, a type of failure is determined and bad-region management is performed depending on the type of failure.

According to an aspect of the application, there is provided a resistive memory device including a memory cell array that includes memory layers stacked in a vertical direction, wherein each of the memory layers includes memory cells disposed in regions where first lines and second lines cross each other. A bad region management unit defines, as a bad region, a first memory layer having a bad cell from among the memory cells and at least one second memory layer.

In some embodiments, the bad cell includes a memory cell where a short failure occurs, and in the case of the short failure, a current that is more than a pre-set reference value flows when a bias voltage is applied at both ends of the memory cell.

In some embodiments, the second memory layer includes at least two memory layers that are disposed adjacent to an upper surface and a lower surface of the first memory layer.

In some embodiments, the second memory layer includes a memory layer sharing at least one selected from the first line and the second line with the first memory layer.

In some embodiments, the second memory layer includes a memory layer to which at least two bias voltages from among bias voltages are applied, when the bias voltages are applied to the first memory layer.

In some embodiments, the bad region management unit includes a bad region storage unit that stores information of the bad region; and an address mapping controller that translates an input address to an address corresponding to a normal region when the input address that is input from the outside corresponds to the bad region.

In some embodiments, the bad region management unit detects whether the bad cell exists, or where the first memory layer is located, based on the amount of current flowing through at least one memory cell from among the memory cells.

In some embodiments, each of the memory layers shares one selected from the first lines and the second lines with the other adjacent memory layers.

According to another aspect of the application, there is provided an operating method of a resistive memory device including a memory cell array in which memory layers are stacked. The method includes detecting a bad memory layer where a short failure occurs; defining, as a bad region, the bad memory layer and at least another memory layer; and performing a write or read operation on normal memory layers which are memory layers, except for memory layers defined as the bad region.

According to another aspect of the application, there is provided an operating method of a resistive memory device comprising a memory cell array in which memory layers are stacked. The method includes detecting that a failure occurs in a memory cell; determining a type of the failure based on the amount of current flowing in the memory cell; and performing bad region management based on the type of the failure.

According to another aspect of the application, there is provided a method executed by a memory system of operating a nonvolatile memory. The method includes detecting a first-type failure of a first memory cell of the nonvolatile memory; identifying a first memory layer in which the first memory cell exists within the nonvolatile memory; and identifying a second memory layer having a second memory cell that is addressed by a bit or word line that also addresses the first memory cell. A memory operation directed to a memory cell within the first or second memory layers is redirected to a memory cell of first and second substitute memory layers, respectively, that differ from the first and second memory layers. Each of the first and second memory layers includes memory cells that are addressed by a set of bit and word lines that are common to the first and second memory layers.

In some embodiments, the first and second memory layers are disposed adjacent to each other in the nonvolatile memory.

In some embodiments, the first-type failure of the first memory cell is detected when a first predetermined reference current is determined to flow through the first memory cell.

In some embodiments, all memory cell addresses of the first and second memory layers are remapped to memory cell addresses of the first and second substitute memory layers, respectively and the remapped information is stored in another nonvolatile memory.

In some embodiments, a second-type failure of a third memory cell of the nonvolatile memory is detected when a second predetermined reference current, which is less than the first predetermined reference current, is determined to flow through the third memory cell. A third memory layer is identified in which the third memory cell exists within the nonvolatile memory. A memory operation directed to a memory cell within the third memory layer is redirected to a memory cell of a third substitute memory layer that differs from the third memory layer.

According to another aspect of the application, there is provided a memory system having a nonvolatile memory and control logic. The control logic detects a first-type failure of a first memory cell of the nonvolatile memory; identifies a first memory layer in which the first memory cell exists within the nonvolatile memory; identifies a second memory layer having a second memory cell that is addressed by a bit or word line that also addresses the first memory cell; and redirects a memory operation directed to a memory cell within the first or second memory layers to a memory cell of first and second substitute memory layers, respectively, that differ from the first and second memory layers. Each of the first and second memory layers includes memory cells that are addressed by a set of bit and word lines that are common to the first and second memory layers.

In some embodiments, the first and second memory layers are disposed adjacent to each other in the nonvolatile memory.

In some embodiments, the first-type failure of the first memory cell is detected when a first predetermined reference current is determined to flow through the first memory cell.

In some embodiments, all memory cell addresses of the first and second memory layers are remapped to memory cell addresses of the first and second substitute memory layers, respectively. The remapped information is stored in another nonvolatile memory.

In some embodiments, a second-type failure of a third memory cell is detected when a second predetermined reference current, which is less than the first predetermined reference current, is determined to flow through the third memory cell. A third memory layer is identified in which the third memory cell exists within the nonvolatile memory. A memory operation directed to a memory cell within the third memory layer is redirected to a memory cell of a third substitute memory layer that differs from the third memory layer.

BRIEF DESCRIPTION OF THE DRAWINGS

Exemplary embodiments of the application will be more clearly understood from the following detailed description taken in conjunction with the accompanying drawings in which:

FIGS. 11A and 11B show methods of replacing the memory layer of the bad region;

DETAILED DESCRIPTION OF THE EMBODIMENTS

Figure 1:
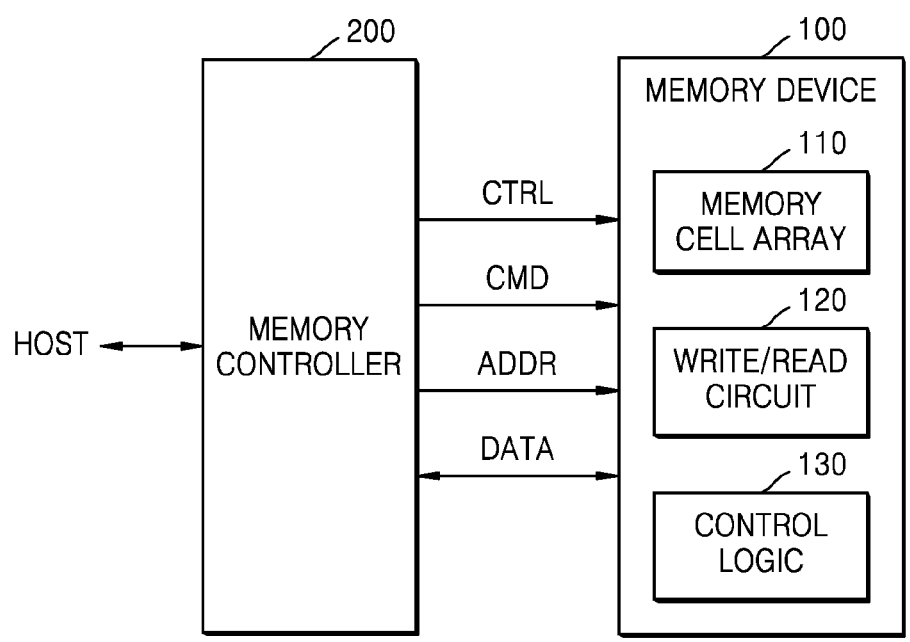
FIG. 1 is a schematic block diagram illustrating a memory system including a resistive memory device, according to an exemplary embodiment of the application.

The present application will now be described more fully with reference to the accompanying drawings, in which exemplary embodiments of the application are shown. The application may, however, be embodied in many different forms, and should not be construed as being limited to the exemplary embodiments set forth herein. Thus, the application may include all revisions, equivalents, or substitutions which are included in the concept and the technical scope related to the present application. Like reference numerals in the drawings denote like elements. In the drawings, the dimension of structures may be exaggerated for clarity.

Furthermore, all examples and conditional language recited herein are to be construed as being not limited to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the application.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic block diagram illustrating a memory system including a resistive memory device, according to an exemplary embodiment or the application.

Referring to FIG. 1, a memory system 10 may include a resistive memory device 100 (hereinafter, referred as the memory device 100) and a memory controller 200. The memory device 100 may include a memory cell array 110, a write/read circuit 120, and a control logic 130. Also, the memory device 100 may further include circuits performing write and read operations on the memory cell array 110 according to control of the control logic 130. Since the memory cell array 110 includes resistive memory cells, the memory system 10 may be referred to as a resistive memory system.

In response to a write/read request from a host, the memory controller 200 may read data stored in the memory device 100 or may control the memory device 100 to write data to the memory device 100. In detail, the memory controller 200 may provide an address ADDR, a command CMD, and a control signal CTRL to the memory device 100 and thus may control a program (or write) operation, a read operation, and an erase operation in the memory device 100. Also, data DATA to be written and read data DATA may be transmitted between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and Integrated Drive Electronics (IDE).

The memory cell array 110 may include a plurality of memory cells (not shown) that are disposed respectively in regions where a plurality of first signal lines and a plurality of second signal lines cross each other. In an exemplary embodiment, the plurality of first signal lines may be bit lines, and the plurality of second signal lines may be word lines. In another exemplary embodiment, the plurality of first signal lines may be word lines, and the plurality of second signal lines may be bit lines.

In the current exemplary embodiment, the memory cell array 110 may be formed with a three-dimensional (3D) structure in which memory cells having a two-dimensional (2D) horizontal structure (hereinafter, referred to as a "memory layer") are stacked in a vertical direction.

According to an exemplary embodiment, the memory cell array 110 may include a plurality of cell regions. The cell regions may be defined in various ways. For example, a cell region may include a plurality of memory cells, and the plurality of memory cells are connected to the word lines and the bit lines. In addition, the word lines may be connected to one row decoder (or a row selection block) and the bit lines may be connected to one column decoder (or a column selection block), and the above-described cell region may be defined as a tile. In other words, the memory cell array 110 may include a plurality of tiles. In addition, the plurality of tiles may have a 3D structure including a plurality of memory layers.

In the current exemplary embodiment, each of the plurality of memory cells may be a single level cell (SLC) that stores one-bit data, or may be a multi-level cell (MLC) that stores at least two-bit data. Alternatively, the memory cell array 110 may include both the SLC and the MLC. When one-bit data is written to one memory cell, the memory cells may have two resistance level distributions according to the written data. Alternatively, when two-bit data is written to one memory cell, the memory cells may have four resistance level distributions according to the written data. In another exemplary embodiment, if a memory cell is a triple level cell (TLC) that stores three-bit data, the memory cells may have eight resistance level distributions according to the written data. However, one or more exemplary embodiments of the application are not limited thereto. Thus, in other exemplary embodiments, each of the memory cells may store at least four-bit data.

The memory cell array 110 may include resistive memory cells including a variable resistor (not shown) having a variable resistance. As one example, if a resistance of the variable resistor formed of a phase change material (e.g., Ge—Sb—Te (GST)) changes as a temperature change, a resistive memory device may be phase change RAM (PRAM). As another example, when the variable resistor is formed by an upper electrode, a lower electrode, and transition metal oxide therebetween, the resistive memory device may be resistive RAM (RRAM). As another example, when the variable resistor is formed of an upper electrode of a magnetic material, a lower electrode of a magnetic material, and a dielectric therebetween, the resistive memory device may be magnetic RAM (MRAM).

The write/read circuit 120 performs write and read operations on the memory cells. The write/read circuit 120 is connected to the memory cells via the bit lines, and may include a write driver that writes data to the memory cells, and a sense amplifier that amplifies data read from the memory cells.

The control logic 130 may generally control the operations of the memory device 100 and may also control the other circuits to perform memory operations such as the write and read operations. In an exemplary embodiment, the control logic 130 may detect a memory cell having a failure that may not be fixed (hereinafter, referred to as "bad cell") in the memory cell array 110 and manage a region including the bad cell. The control logic 130 determines a type of failure and manages the bad cell depending on the type of the failure. In an exemplary embodiment, the control logic 130 determines which type of failure occurs in a memory cell based on the amount of current flowing through the memory cell. In this case, when the failure turns out to be a short failure allowing an excessive current flow, the control logic 130 may perform a bad region management for the short failure, whereas when failures, except for the short failure (hereinafter, referred to as "non-short failure"), occur, the control logic 130 may perform a bad region management for a non-short failure.

In an exemplary embodiment of the application, when the control logic 130 determines that a short failure occurs, the control logic 130 may define as a bad region a memory layer including a cell where a short failure occurs (hereinafter, referred to as "bad memory layer") and at least one of the other memory layers. When the control logic 130 determines that a non-short failure occurs, the control logic 130 may define as a bad region a memory layer where the non-short failure occurs.

In addition, the control logic 130 may mark the memory layers, which are defined as bad regions, as the bad region, and may prevent the bad region from being accessed.

In addition, the memory controller 200 and the memory device 100 may be integrated into a semiconductor device. For example, the memory controller 200 and the memory device 100 may be integrated into a semiconductor device and thus may configure a memory card. As one example, the memory controller 200 and the memory device 100 may be integrated into a semiconductor device and thus may configure a PC card such as a peripheral computer memory card international association (PCMCIA) card, a compact flash card (CF), a smart media card (SM/SMC), a memory stick, a multimedia card such as MMC, RS-MMC, or MMCmicro, a secure digital card such as SD, miniSD, or microSD, or universal flash storage (UFS). As another example, the memory controller 200 and the memory device 100 may be integrated into a semiconductor device and thus may configure a Solid State Disk/Drive (SSD).

An operation of the memory device 100 included in the resistive memory system 10 with the aforementioned structure will be described below.

Figure 2:
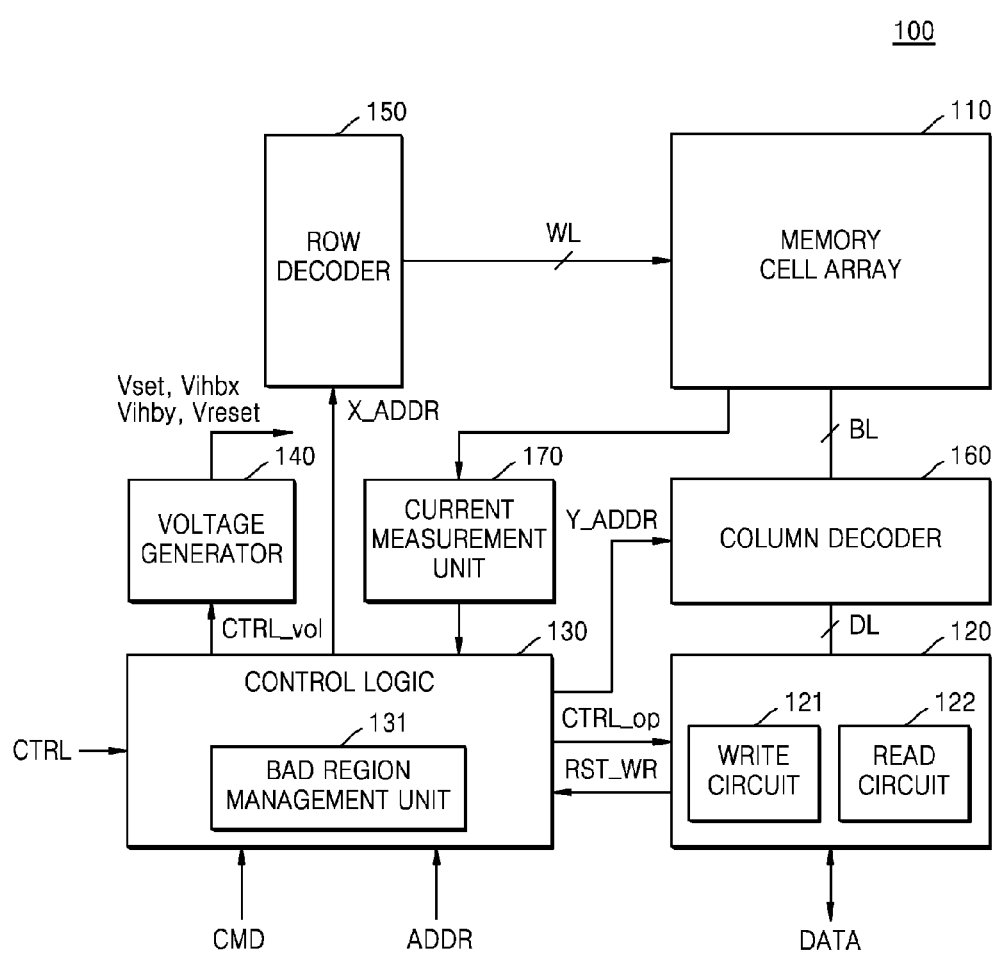
FIG. 2 is a block diagram showing an embodiment of the memory device in FIG. 1.

FIG. 2 is a block diagram of the memory device 100 of FIG. 1, according to an exemplary embodiment of the application.

Referring to FIG. 2, the memory device 100 may include the memory cell array 110, the write/read circuit 120, the control logic 130, and a voltage generator 140. Also, the memory device 100 may further include a row decoder 150, a column decoder 160, and a current measurement unit 170.

The memory cell array 110 may be connected to a plurality of first signal lines and a plurality of second signal lines. Also, the memory cell array 110 may include the plurality of memory cells that are arranged respectively on regions where the plurality of first signal lines and the plurality of second signal lines cross each other. Hereinafter, one or more exemplary embodiments will be described under an assumption that the plurality of first signal lines are bit lines BL and the plurality of second signal lines are word lines WL.

As described above, the memory cell array 110 may have a 3D memory structure with a plurality of memory layers stacked therein, and each of the memory layers may include a plurality of memory cells connecting to the bit lines and the word lines. In an exemplary embodiment, the memory layers may share the word lines or the bit lines with each other. Also, the memory cell array 110 may include a plurality of tiles, and each of the tiles may include a plurality of memory layers stacked in the vertical direction.

An address ADDR that indicates an access-target memory cell may be received from memory controller 200 (see FIG. 2). The address ADDR may include a row address X_ADDR for selecting a word line of the memory cell array 110, and a column address Y_ADDR for selecting a bit line of the memory cell array 110. The row decoder 150 is connected to the memory cell array 110 via the word lines WL and may select at least one of the word lines in response to the row address X_ADDR. The row decoder 150 receives a voltage from the voltage generator 140 and may transfer the voltage to the word lines WL. For example, the row decoder 150 may provide a ground voltage Vss or a reset write voltage Vreset to a selected word line WL and may provide a row inhibit voltage Vihbx to non-selected word lines WL in order to block a leakage current.

The column decoder 160 is connected to the memory cell array 110 via the bit lines BL and may select at least one of the bit lines BL in response to the column address Y_ADDR. The column decoder 160 may receive a voltage from the voltage generator 140 and may provide the voltage to the bit lines BL. Also, the column decoder 160 may receive a write current pulse or a write voltage pulse from the write/read circuit 120 and may transfer the write current pulse or the write voltage pulse to the bit lines BL. For example, the column decoder 160 provides a set voltage Vset, a read voltage Vread, or a ground voltage Vss to a selected bit line BL, and may provide a column inhibit voltage Vihby to non-selected bit lines BL in order to prevent a leakage current.

The write/read circuit 120 is connected to the bit lines BL via the column decoder 160 to write data to the memory cell or to read data from the memory cell. The write/read circuit 120 may write data DATA input from the outside to the memory cell array 110 or output data written in the memory cell array 110, according to control of the control logic 130. Also, the write/read circuit 120 may provide the control logic 130 with a write or read result RST_WR. For example, the write/read circuit 120 performs a verification operation in order to detect the result of the write operation during the write operation and may provide the control logic 130 with the verification result, for example, pass or fail information.

The write/read circuit 120 may include a write circuit 121 and a read circuit 122. The write circuit 121 is connected to the selected bit line BL via the column decoder 160 to provide the selected memory cell MC with a write current pulse or a write voltage pulse, and thus, performs a write operation. Thus, the data DATA to be stored may be input to the memory cell array 110.

The read circuit 122 is connected to the selected bit line BL via the column decoder 160 and may read the data DATA stored in the memory cell array 110 by sensing the resistance value of the selected memory cell MC. Thus, the data DATA stored in the memory cell array 110 may be output.

The control logic 130 may output various control signals to write data DATA to or read data DATA from the memory cell array 110 based on the command CMD, the address ADDR, and the control signal CTRL received from the memory controller 200 (see FIG. 1). The various control signals output from the control logic 130 may be provided to the write/read circuit 120, the voltage generator 140, the row decoder 150, and the column decoder 160, and accordingly, the control logic 130 may control overall operations in the memory device 100.

In detail, the control logic 130 may provide the write/read circuit 120 with various operation control signals CTRL_op. Also, the control logic 130 may provide the row decoder 150 with the row address X_ADDR and may provide the column decoder 160 with the column address Y_ADDR. Moreover, the control logic 130 may control various operations in the memory device 100, based on the write/read operation results RST_WR received from the write/read circuit 120.

The voltage generator 140 may generate various voltages to perform the write, read, and erase operations on the memory cell array 110, based on a voltage control signal CTRL_vol. The voltage generator 140 may generate voltages to drive the word lines WL and bit lines BL, for example, the set write voltage Vset, the reset write voltage Vreset, the row inhibit voltage Vinhx, and a column inhibit voltage Vinhy.

The current measurement unit 170 may be connected to the bit lines or the word lines of the memory cell array 110 and may measure the amount of current flowing through a memory cell. In an exemplary embodiment, the current measurement unit 170 may be a part of the row decoder 150, the column decoder 160 and the write/read circuit 120.

In the current exemplary embodiment of the application, the control logic 130 detects whether or not there is a failure in a memory cell, and in the case that a failure cannot be fixed, the control logic 130 may separate the memory cells having a failure from normal cells to manage the bad cells. To this end, the control logic 130 may include a bad region management unit 131. When a failure occurs in a memory cell, the bad region management unit 131 may define the bad region and manage not to perform a write or read operation on a bad region.

In detail, the bad region management unit 131 may determine the type of the failure that occurs in the memory cell and may define the bad region depending to the type of the failure. In an exemplary embodiment, the bad region management unit 131 may manage the bad region depending on the type of the failure, for example, whether the failure in the memory cell is a short failure or a non-short failure. Here, the "short failure" as used herein refers to a failure, which may not be fixed, in which an excess current abnormally flows when a bias voltage is applied to both ends of the memory cell, and thus the write or read operation may not be normally performed. If the bias voltage is applied to the bad memory layer, the excess current flows, and thus the memory device 100 may not normally operate. In this regard, the memory layer having the short failure is defined as a bad region, and the write or read operation on the bad region is blocked so that the memory device 100 may be prevented from mis-operating.

The bad region management unit 131 may determine whether or not the short failure has occurred based on the amount of current flowing in the memory cell. The bad region management unit 131 measures the amount of current flowing in at least one memory cell having a failure, and then, if the amount of current is equal to or greater than a predetermined amount, it is regarded as a short failure, and if the amount of current is less than the predetermined amount, it is regarded as a non-short failure.

In an exemplary embodiment of the application, when the bad region management unit 131 determines that the short failure has occurred, a memory layer, including the bad cell having the short failure (hereinafter, referred to as "bad memory layer"), and at least another memory layer may both be defined as the bad region. In the case of the short failure, even when the write and read operations are performed on another memory layer adjacent to the bad memory layer, a bias voltage is applied to the bad memory layer, thereby causing an excess leakage current to flow. Accordingly, the bad region management unit 131 may define the bad memory layer as a bad region so that the write or read operation is not performed on the bad memory layer. In addition, a memory layer that is adjacent to the bad memory layer, or shares at least one signal line with the bad memory layer may also be defined as the bad region so that the bias voltage is not applied to the memory layer.

In an exemplary embodiment, the bad region management unit 131 may define the bad memory layer as the bad region and may additionally define as the bad region at least one memory layer that is adjacent to an upper portion or a lower portion of the bad memory layer. In another exemplary embodiment, the bad region management unit 131 may additionally define as the bad region a memory layer that shares at least one signal line with the bad memory layer. In another exemplary embodiment, the bad region management unit 131 may also define as the bad region a memory layer having at least two bias voltages in common with the bad memory layer.

When the bad region management unit 131 determines that the non-short failure has occurred, a memory layer, in which a failure occurs, may be defined as the bad region. In the case of the non-short failure, a bad memory layer does not affect an operation of another memory layer, and the operation of the other memory layer does not affect the bad memory layer. By defining only the bad memory layer as the bad region, the bad region management unit 131 may secure as many memory cells as possible to normally operate.

When the bad region is defined, the bad region management unit 131 may prevent the memory layers defined as the bad region from being accessed. In an exemplary embodiment, the bad region management unit 131 may mark some portions of the memory layer defined as the bad region with a mark representing a bad region. Also, the bad region management unit 131 may replace the memory layers of the bad region with memory layers of the other region and may generate address mapping information between the memory layers of the bad region and the replacement memory layers. When the bad region management unit 131 receives an address corresponding to the memory layer of the bad region, the bad region management unit 131 translates the address to an address corresponding to the other memory layer based on the mapping information so that the other memory layer may be accessed. In this case, the bad region management unit 131 may prevent performing the write or read operation on the memory layer of the bad region.

In an exemplary embodiment, the bad region management unit 131 may replace the memory layers of the bad region with other memory layers within a tile including the bad region. As an example, the tile may include a user area that a user recognizes and requests access thereto; and a reserved area that the user does not recognize, and the replacement memory layer may be at least some of the memory layers of the reserved area. In another exemplary embodiment, the bad region management unit 131 may replace the memory layers of the bad region with memory layers of another tile.

In addition, in an exemplary embodiment, the bad region management unit 131 may provide the memory controller 200 with information on the bad region such as an address of the bad region or data that informs whether or not each of the memory layers is the bad region, so that the memory controller 200 (see FIG. 1) may perform address mapping (for example, translating a logical address received from an external source to a physical address) for the regions, except for the bad region.

In the current exemplary embodiment, it is described that the bad region management unit 131 is included in the control logic 130, but is not limited thereto. The bad region management unit 131 may be formed as software or hardware, independent from the control logic 130.

Figure 3A:
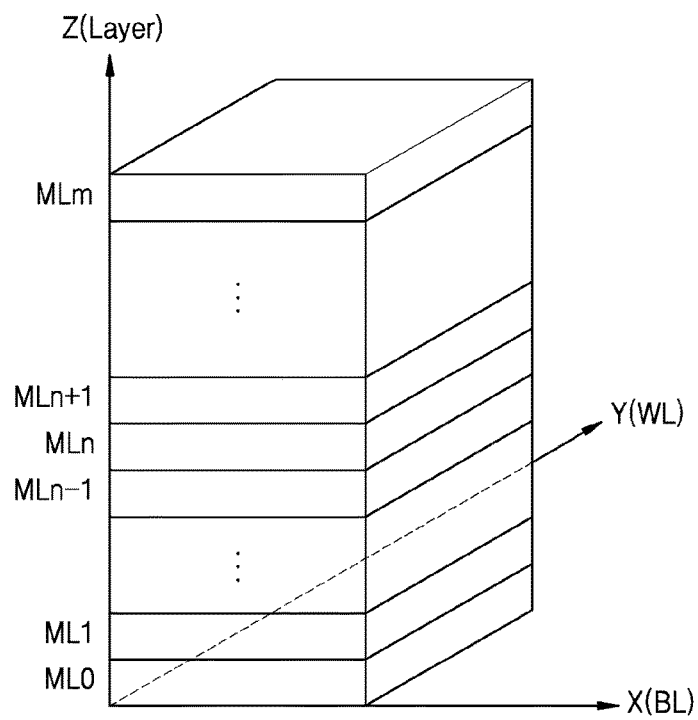
FIGS. 3A to 3D are structural diagrams and circuit diagrams showing an embodiment of a memory cell array in FIG. 2.
Figure 3B:
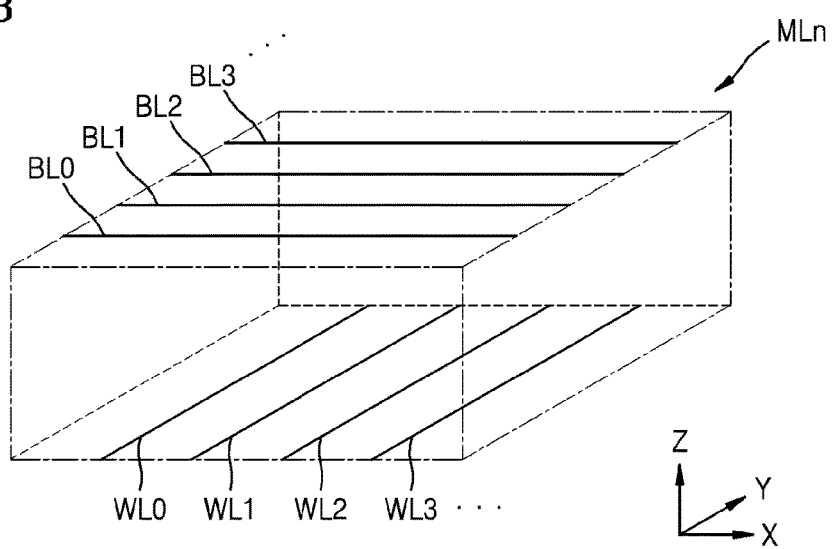
Figure 3C:
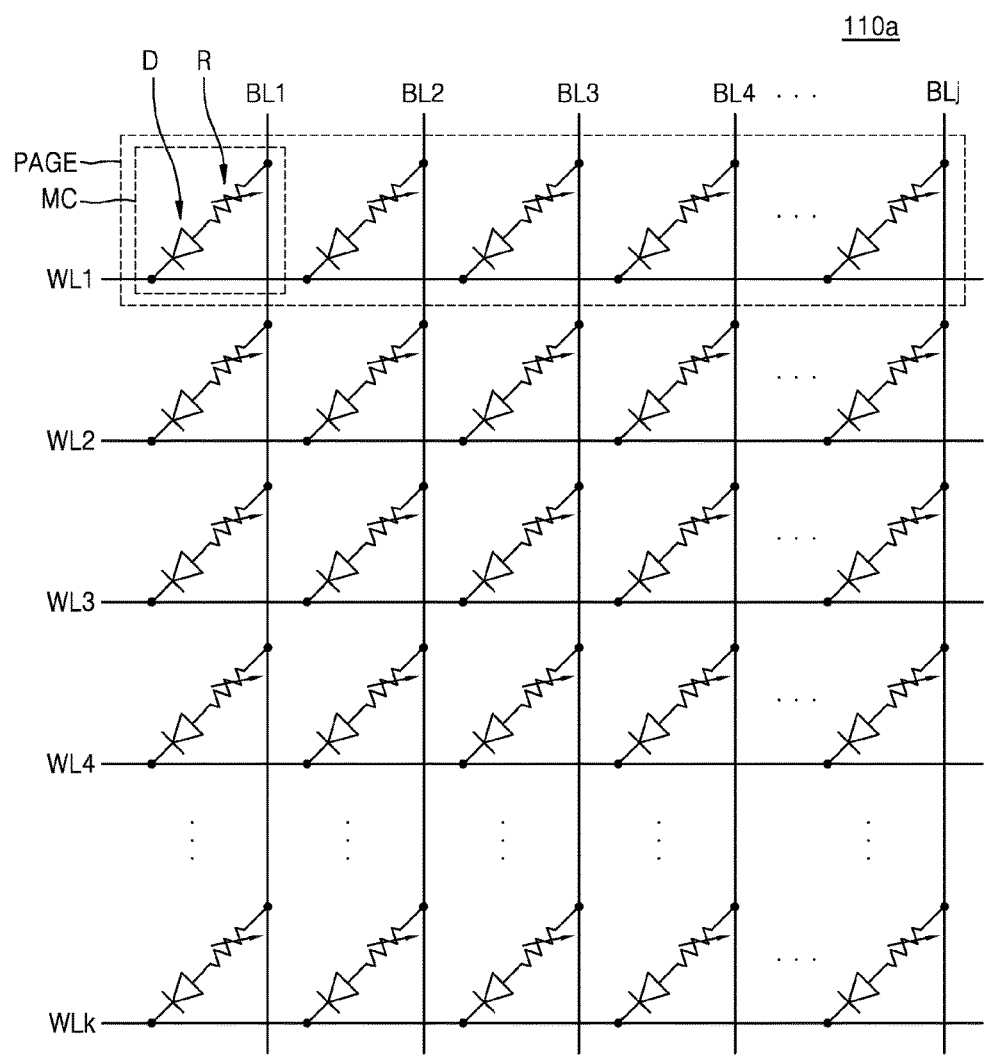
Figure 3D:
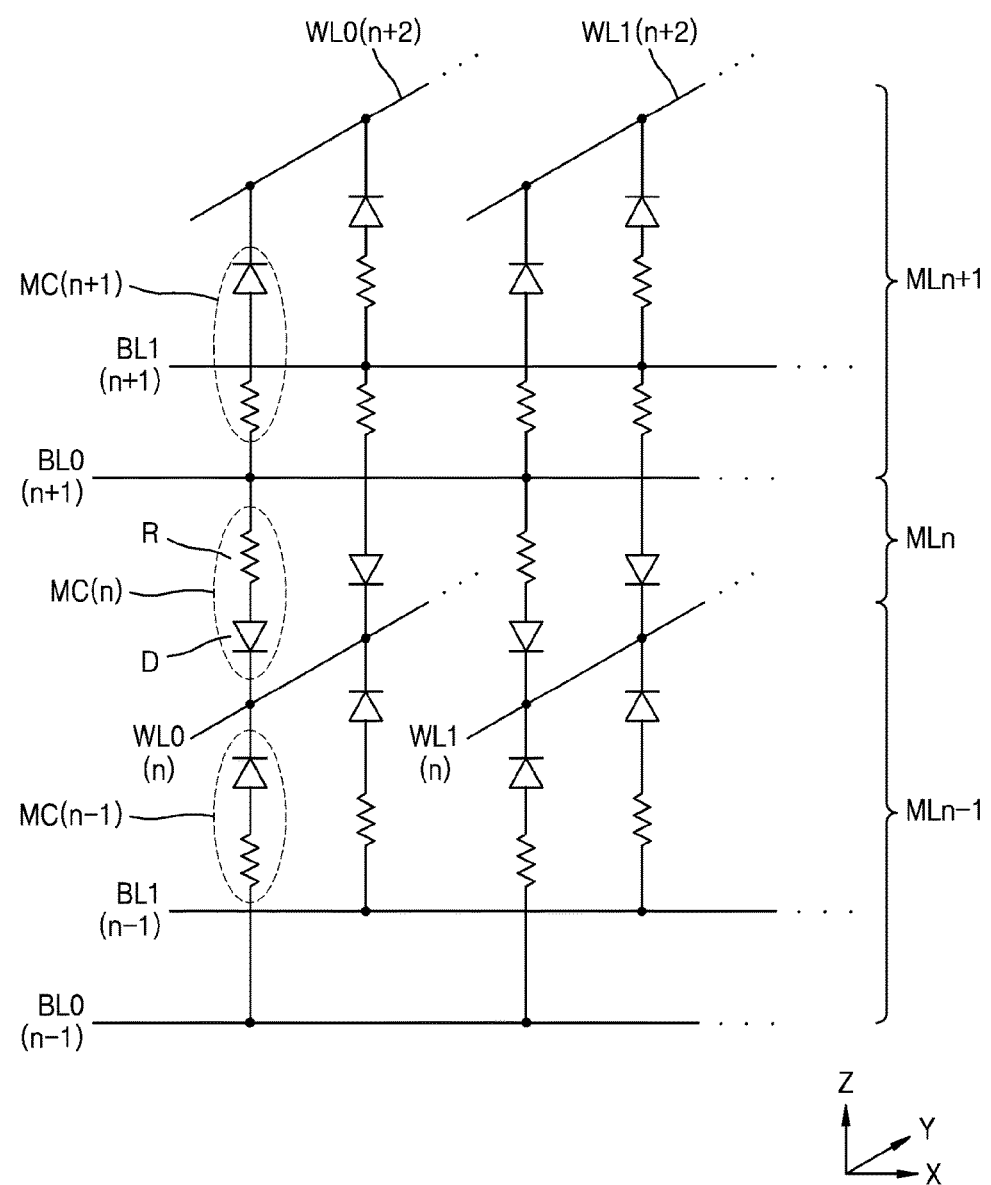

FIGS. 3A to 3D are structural diagrams and circuit diagrams showing an embodiment of the memory cell array 110 in FIG. 2. FIG. 3A is a structural diagram showing an entire structure of the memory cell array 110, FIG. 3B is a structural diagram showing how word lines and bit lines are arranged in a memory layer, FIG. 3C is a circuit diagram of the memory layer, and FIG. 3D is a circuit diagram of the memory layer showing the stacked structure thereof.

Referring to 3A, the memory cell array 110 has a 3D structure and is formed with 2D memory layers on an X-Y plane that are stacked in a Z-axis direction. In the current exemplary embodiment, m+1 memory layers (where m is an integer equal to and greater than 1) from a lowermost memory layer ML0 to an uppermost memory layer MLm are illustrated. An X-axis may be for a bit line BL, a Y-axis may be for a word line WL, and a Z-axis may be a direction in which the memory layers ML0 to MLm are stacked. In an exemplary embodiment, the Z-axis may be perpendicular to a substrate (not shown) on which the memory cell array 110 is disposed.

FIG. 3B shows how the word lines and the bit lines are arranged in one memory layer MLn. As illustrated in FIG. 3B, a plurality of word lines WL0, WL1, WL2, and WL3 and a plurality of bit lines BL0, BL1, BL2, and BL3 are respectively disposed on a lower surface and an upper surface of the memory layer MLn (where n is an integer greater than 1, and equal to or less than m) to cross orthogonally in a plan view defined by the X-Y plane and may be alternately disposed in the Z-axis direction in which the memory layers are stacked. In an exemplary embodiment, the word lines WL0, WL1, WL2, and WL3 and the bit lines BL0, BL1, BL2, and BL3 in the memory layer MLn may be shared with other memory layers MLn−1 and MLn+1. For example, the word lines WL0, WL1, WL2, and WL3 are shared between the memory layer MLn and the memory layer MLn−1, which is a lower layer, and the bit lines BL0, BL1, BL2, and BL3 are shared between the memory layer MLn and the memory layer MLn+1, which is an upper layer.

FIG. 3C is a circuit diagram of one memory layer 110a showing an embodiment of the memory cell array 110 in FIG. 2. Referring to FIG. 3C, the memory cell layer 110a may have a 2D memory defined by the X-Y plane and include a plurality of word lines WL1 to WLk, a plurality of bit lines BL1 to BLj, and a plurality of memory cells MC. The number of word lines WL, bit lines BL, and memory cells MC may vary for each of the exemplary embodiments. Also, the memory cells MC selected by the same word line WL may be defined as a page PAGE unit.

In the current exemplary embodiment, each of the memory cells MC may include a variable resistor R and a selection device D. Here, the variable resistor R may be called a variable resistance material, and the selection device D may be called a switching device.

In an exemplary embodiment, the variable resistor R may be disposed between one of the bit lines BL1 to BLj and the selection device D, and the selection device D may be disposed between the variable resistor R and one of the word lines WL1 to WLk. However, the application is not limited thereto. The selection device D may be disposed between one of the bit lines BL1 to BLj and the variable resistor R, and the variable resistor R may be disposed between the selection device D and one of the word lines WL1 to WLk.

The selection device D may be disposed between one of the word lines WL1 to WLn and the variable resistor R and control current supply to the variable resistor R depending on a voltage applied to the word line, which is connected to the selection device D, and a bit line. In FIG. 3C, the selection device D is illustrated as a diode, but is not limited thereto. In another exemplary embodiment, the selection device D may be changed to another switching device.

FIG. 3D is a circuit diagram showing that the plurality of the memory layers in FIG. 3C are stacked therein. FIG. 3D shows how the memory cells MC, the word lines WL, and the bit lines BL are connected to each other.

Hereinafter, when needed, a number in parentheses will be added to a reference numeral and the number in parentheses refers to a number of a memory layer where an element represented by the reference numeral is included. For example, a memory cell MC(n) refers to the memory cell included in an nth memory layer MLn. Also, for the sake of convenience, the word lines and the bit lines shared between two memory layers are regarded to belong to the lower surface of each of the memory layers, and marked with the number that denotes the number of the memory layer.

Referring to FIG. 3D, the memory layers MLn−1, MLn, and MLn+1 may be stacked in one direction, for example a perpendicular direction to the substrate on which the memory cell array 110 is disposed. Each of the memory layers MLn−1, MLn, and MLn+1 may include the memory cells MC(n−1), MC(n), and MC(n+1), and the word lines WL0 and WL1 and the bit lines BL0 and BL1 may be connected to both ends of the memory cells MC(n−1), MC(n), and MC(n+1).

In an exemplary embodiment, the word lines and the bit lines may be shared between the adjacent memory layers. Referring to FIG. 3D, the memory layer MLn and the upper memory layer MLn+1 may share the bit lines BL0($n$+1) and BL1($n$+1). In addition, the memory layer MLn and the lower memory layer MLn−1 may share the word lines WL0($n$) and WL1($n$). In the current exemplary embodiment, the memory layers share the bit lines or the word lines with each other, and a memory layer shares a word line and a bit line with a lower memory layer and an upper memory layer respectively. However, the application is not limited thereto. In another exemplary embodiment, a memory layer may share a word line or a bit line with one of the adjacent layers, or a memory layer may share a word line or a bit line with a memory layer that is disposed spaced apart therefrom.

Figure 4:
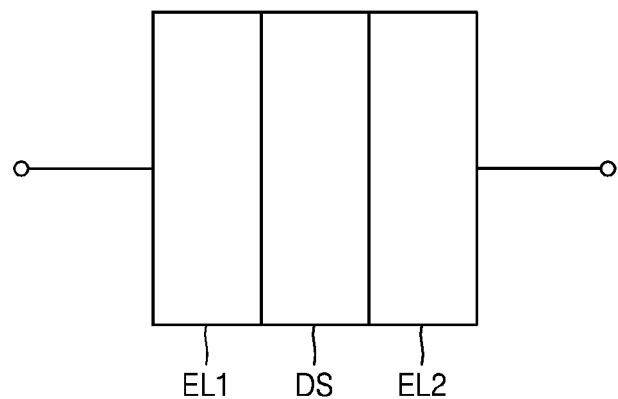
FIG. 4 is a diagram of a variable resistor included in a memory cell MC of FIG. 3C.

FIG. 4 is a diagram of the variable resistor R included in the memory cell MC of FIG. 3C.

Referring to FIG. 4, the variable resistor R includes first and second electrodes EL1 and EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide (IrO2), strontium zirconate oxide (StZrO3), or the like.

The data storage film DS may be a bipolar resistive memory material or a unipolar resistive memory material. The bipolar resistive memory material may be programmed to a set state or a reset state depending on a polarity of a pulse. Also, the bipolar resistive memory material may be a perovskite-based material. However, the unipolar resistive memory material may be programmed to a set state or a reset state even by a pulse having the same polarity, and the unipolar resistive memory material may be a transition metal oxide such as NiOx or TiOx.

FIGS. 5A through 5D are circuit diagrams showing modified examples of the memory cell MC shown in FIG. 3C.

Figure 5A:
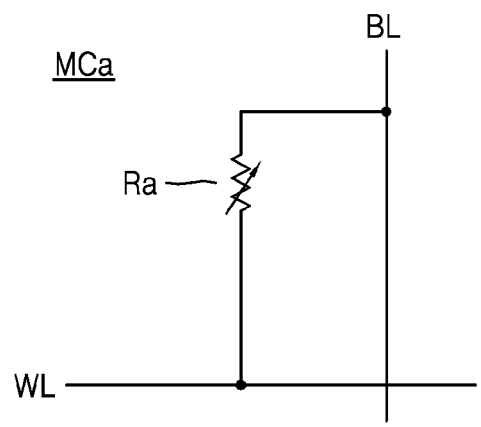
FIGS. 5A through 5D are circuit diagrams showing modified examples of the memory cell MC shown in FIG. 3C.

Referring to FIG. 5A, a memory cell MCa includes a variable resistor Ra, and the variable resistor Ra may be connected to a bit line BL and a word line WL. The memory cell MCa may store data by using voltages applied to the bit line BL and the word line WL.

Figure 5B:
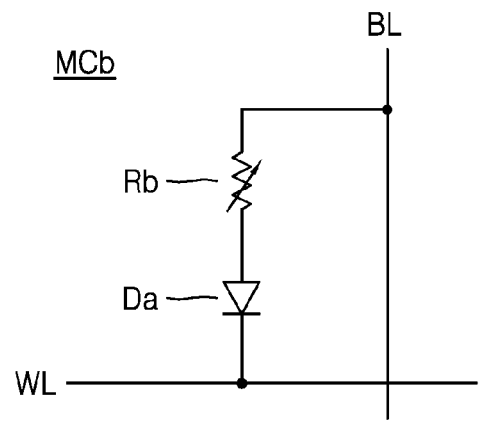

Referring to FIG. 5B, a memory cell MCb may include a variable resistor Rb and a unidirectional diode Da. The variable resistor Rb may include a resistance material to store data. The unidirectional diode Da may be a selection device to supply or block a current to the variable resistor Rb depending on a bias voltage applied to the word line WL and the bit line BL, that is, a switching device. The unidirectional diode Da may be connected between the variable resistor Rb and the word line WL, and the variable resistor R may be connected between the bit line BL and the unidirectional diode Da. The locations of the unidirectional diode Da and the variable resistor R may be exchanged with each other.

In an exemplary embodiment, the unidirectional diode Da may be a PN junction or a PIN junction diode, and an anode of the unidirectional diode Da may be connected to the variable resistor Rb, and a cathode of the unidirectional diode Da may be connected to one of the word lines WL1 to WLn. In this case, when the difference between voltages of the anode and the cathode of the unidirectional diode Da is greater than a threshold voltage of the unidirectional diode Da, the unidirectional diode Da turns on to supply current to the variable resistor Rb.

Figure 5C:
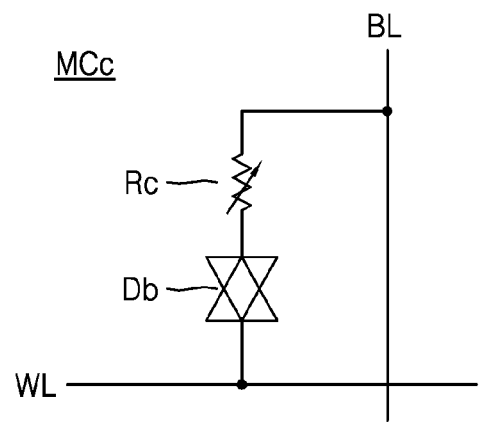

Referring to FIG. 5C, a memory cell MCc may include a variable resistor Rc and a bidirectional diode Db. The variable resistor Rc may include a resistance material to store data. The bidirectional diode Db is connected between the variable resistor Rc and the word line WL, and the variable resistor Rc may be connected between the bit line BL and the bidirectional diode Db. Locations of the bidirectional diode Db and the variable resistor Rc may be exchanged with each other. A leakage current flowing in non-selected resistor cells may be blocked by the bidirectional diode Db.

Figure 5D:
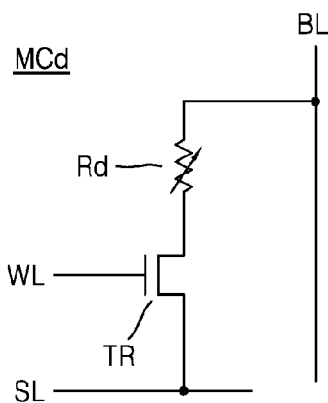

Referring to FIG. 5D, a memory cell MCd may include a variable resistor Rd and a transistor TR. The transistor TR may be a selection device to supply or block a current to the variable resistor Rd depending on a voltage of the word line WL, that is, a switching device. The transistor TR is connected between the variable resistor Rd and the source line SL, and the variable resistor Rd may be connected between the bit line BL and the transistor TR. Locations of the transistor TR and the variable resistor Rd may be exchanged with each other. The memory cell MCd may be selected or may not be selected according to an on/off state of the transistor TR driven by the word line WL. When the transistor TR is turned on, the variable resistor Rb receives supply current from the source line SL.

Figure 6:
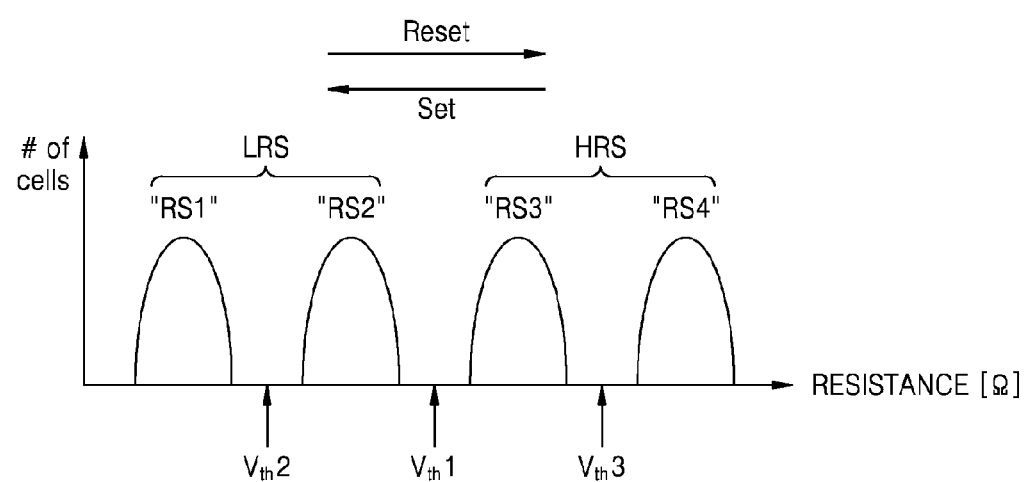
FIG. 6 is a graph showing distributions of the memory cells MC depending on resistance thereof when the memory cell MC is a multi-level cell.

FIG. 6 is a graph showing distributions of the memory cells MC depending on resistances thereof when the memory cell MC is a multi-level cell.

Referring to FIG. 6, a horizontal axis denotes resistance, and a vertical axis denotes the number of memory cells MC. For example, when the memory cell MC is an MLC to which 2 bits are programmed, the memory cell MC may have one state selected from a first resistance state RS1, a second resistance state RS2, a third resistance state RS3, and a fourth resistance state RS4.

However, the application is not limited thereto. In another exemplary embodiment, the memory cells may include triple level cells TLC to store 3-bit data, and thus, may have one of 8 resistance states.

When the memory cell MC is an MLC to which 2 bits are programmed, the memory cell MC has two resistance states such as a high resistance state HRS and a low resistance state LRS. In the case of the MLC, a distance between the resistance distributions is smaller than that of an SLC, and thus, a read error may occur even by a small change in resistance. Therefore, each of the resistance states, namely, the first to fourth resistance states RS1, RS2, RS3, and RS4, may have resistance ranges that do not overlap with each other to secure a read margin.

In the current exemplary embodiment, a first threshold resistance level Vth1 maybe between those of the second resistance state RS2 and the third resistance state RS3. Here, the first resistance state RS1 and the second resistance state RS2 that are below the first threshold resistance level Vth1 may be referred to as the low resistance state LRS, whereas the third resistance state RS3 and the fourth resistance state RS4 that are above the first threshold resistance level Vth1 may be referred to as the high resistance state HRS. In addition, a second threshold resistance level Vth2 may be between those of the first resistance state RS1 and the second resistance state RS2. The memory cells MC in the low resistance state LRS may be classified into the first resistance state RS1 and the second resistance state RS2, based on the second threshold resistance level Vth2. Also, a third threshold resistance level Vth3 may be between those of the third resistance state RS3 and the fourth resistance state RS4. The memory cells MC in the high resistance state HRS may be classified into the third resistance state RS3 and the fourth resistance state RS4 based on the third threshold resistance level Vth3.

Each of the resistance states, namely, the first to fourth resistance states RS1, RS2, RS3, and RS4, may be any one selected from data '00', data '01', data '10', and data '11'. In an exemplary embodiment, a resistance level R may be increased in an order of data '11', data '01', data '00', and data '10'. In other words, the first resistance state RS1 may be data '11', the second resistance state RS2 may be data '01', the third resistance state RS3 may be data '00', and fourth resistance state RS4 may be data '10'.

A set operation or a set write operate refers to a switching operation for the memory cell MC from the high resistance state HRS to the low resistance state LRS by applying a write pulse to the memory cell MC. In addition, a reset operation or a reset write operation refers to a switching operation for the memory cell MC from the low resistance state LRS to the high resistance state HRS by applying a write pulse to the memory cell MC.

Figure 7:
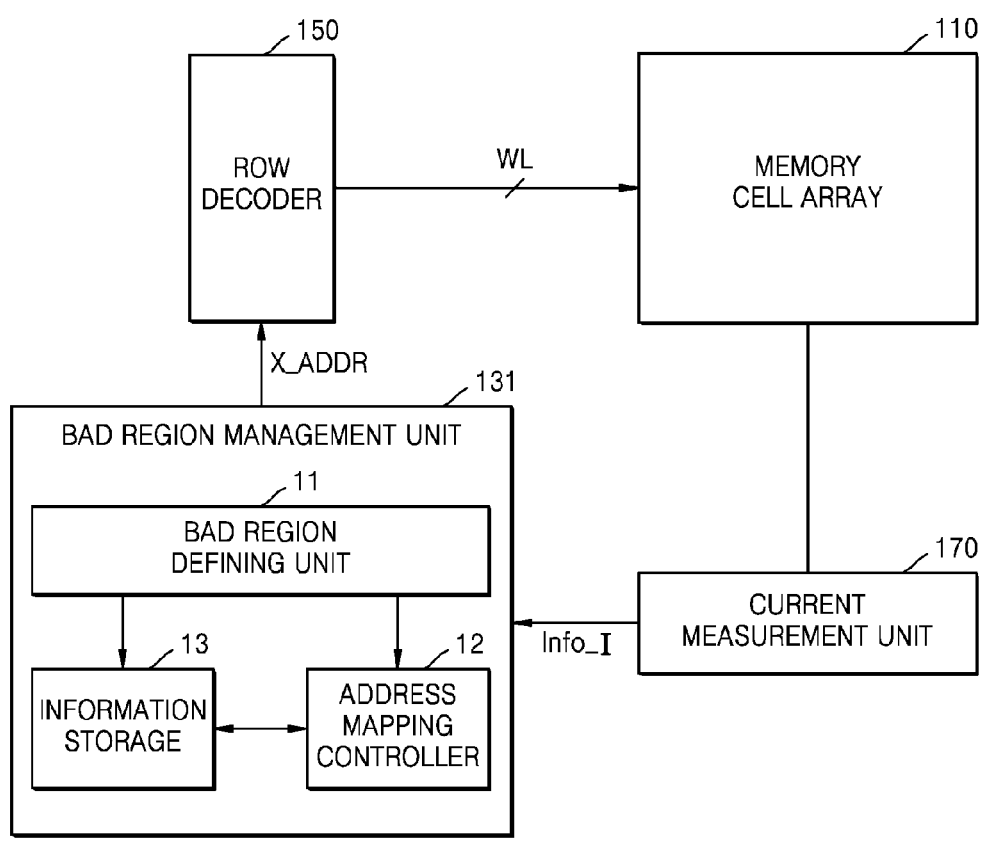
FIG. 7 is a block diagram of a bad region management unit of a memory device according to an exemplary embodiment of the application.

FIG. 7 is a block diagram of the bad region management unit 131 of a memory device according to an exemplary embodiment of the application. For the sake of convenience, the memory cell array 110, the row decoder 150, and the current measurement unit 170 are illustrated together with the bad region management unit 131.

Referring to FIG. 7, the bad region management unit 131 may include a bad region defining unit 11, an address mapping controller 12, and an information storage unit 13.

The bad region defining unit 11 determines the type of the failure based on the amount of current Info_I measured by the current measurement unit 170 and defines a bad region depending on the type of the failure. The bad region defining unit 11 may mark as the bad region the memory layer defined as the bad region.

In an exemplary embodiment, the bad region defining unit 11 calculates the amount of current flowing in one memory cell based on the measured amount of current Info_I, and if the calculated amount of current is equal to or greater than the amount of current flowing in the memory cell in the first resistance state RS1, which has the lowest resistance, the memory cell is assumed to have a short failure. In another exemplary embodiment, the bad region defining unit 11 determines that the memory cell has the short failure if the amount of current flowing to the memory cell is equal to or greater than a predetermined value.

When the memory cell array 110 is assumed to have a short failure, the bad region defining unit 11 may detect the location of the bad memory layer having the short failure and may define as the bad region the bad memory layer and at least one adjacent memory layer. In an exemplary embodiment, the bad region defining unit 11 may sequentially perform a read operation or apply a bias voltage to the memory layers, and then, based on the amount of current flowing in the memory layers, may detect a location of the memory layer, for example a physical address, in which the failure occurs. For example, when the bias voltage is applied to the memory layer having the short failure, more current may flow in the memory than when the bias voltage is applied to the other memory layer. Accordingly, the memory layer, in which relatively greater amount of current flows compared to the other memory layers or in which the amount of current flowing therein is equal to or greater than a pre-set threshold value, may be defined as the bad memory layer. In an another exemplary embodiment, if the amount of current is measured by applying a bias voltage to one memory layer to determine the type of the failure, a memory layer biased at that time may be defined as the bad memory layer.

The bad region defining unit 11 may define as the bad region the bad memory layer and at least one memory layer adjacent to the bad memory layer. Moreover, a memory layer that is adjacent to the bad memory layer or shares at least one signal line with the bad memory layer may also be defined as the bad region. In an exemplary embodiment, the bad region defining unit 11 may define as the bad region the bad memory layer and at least one selected from the upper and lower memory layers of the bad memory layer. In another exemplary embodiment, the bad region defining unit 11 may define as the bad region the bad memory layer and a memory layer that shares the bit line or the word line with the bad memory layer. In another exemplary embodiment, the bad region defining unit 11 may define as the bad region a memory layer to which at least two common bias voltages from among bias voltages applied to the bad memory layer are applied during the write or read operation and the bad memory layer.

Otherwise, when the memory cell is assumed to have the non-short failure, the bad region defining unit 11 may define the memory layer having the non-short failure as the bad region.

The information storage unit 13 may store information on the bad region defined above. The information storage unit 13 may receive information such as locations of the memory layers in the bad region, for example an address, and the type of the failure from the bad region defining unit 11, and may store the information. In an exemplary embodiment, the information storage unit 13 may be positioned in a region of the memory cell array 110. Alternatively, the information storage unit 13 may be embodied in a form of a register in the bad region management unit 131.

The address mapping controller 12 may control the write or read operation not to be performed on the bad region. The address mapping controller 12 may replace the memory layers defined as the bad region with other memory layers and perform the write and read operations on the replacement memory layers when there is a request for the write or read operation to the memory layer in the bad region.

For example, if an input address indicates the memory layer defined as the bad region, the input address is translated to an address of the replacement memory layers, and the row address X_ADDR is generated based on the translated address in order to provide the generated row address X_ADDR to the row decoder 150.

In an exemplary embodiment, when the memory controller 200 (see FIG. 1) controls access to the bad region, the address mapping controller 12 may be omitted.

Figure 8A:
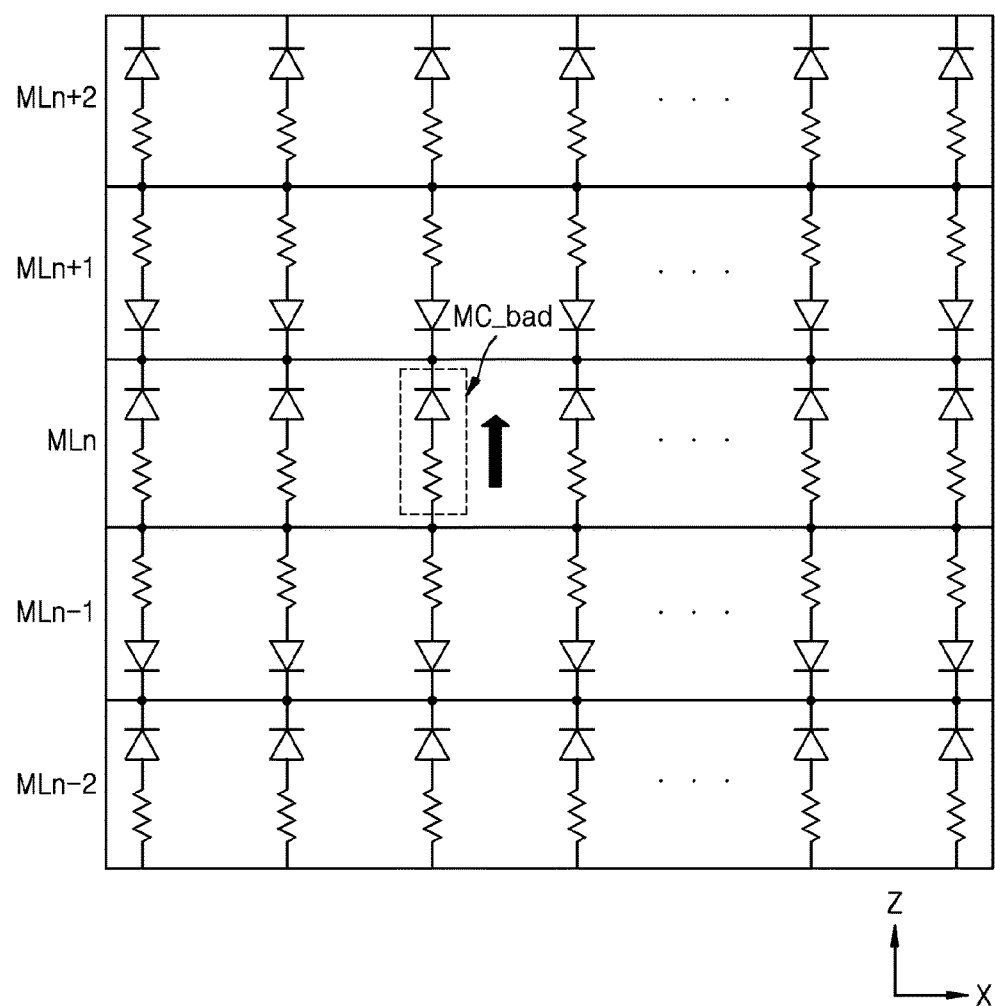
FIGS. 8A and 8B show an example of defining the bad region in the case of a short failure according to an exemplary embodiment of the application.
Figure 8B:
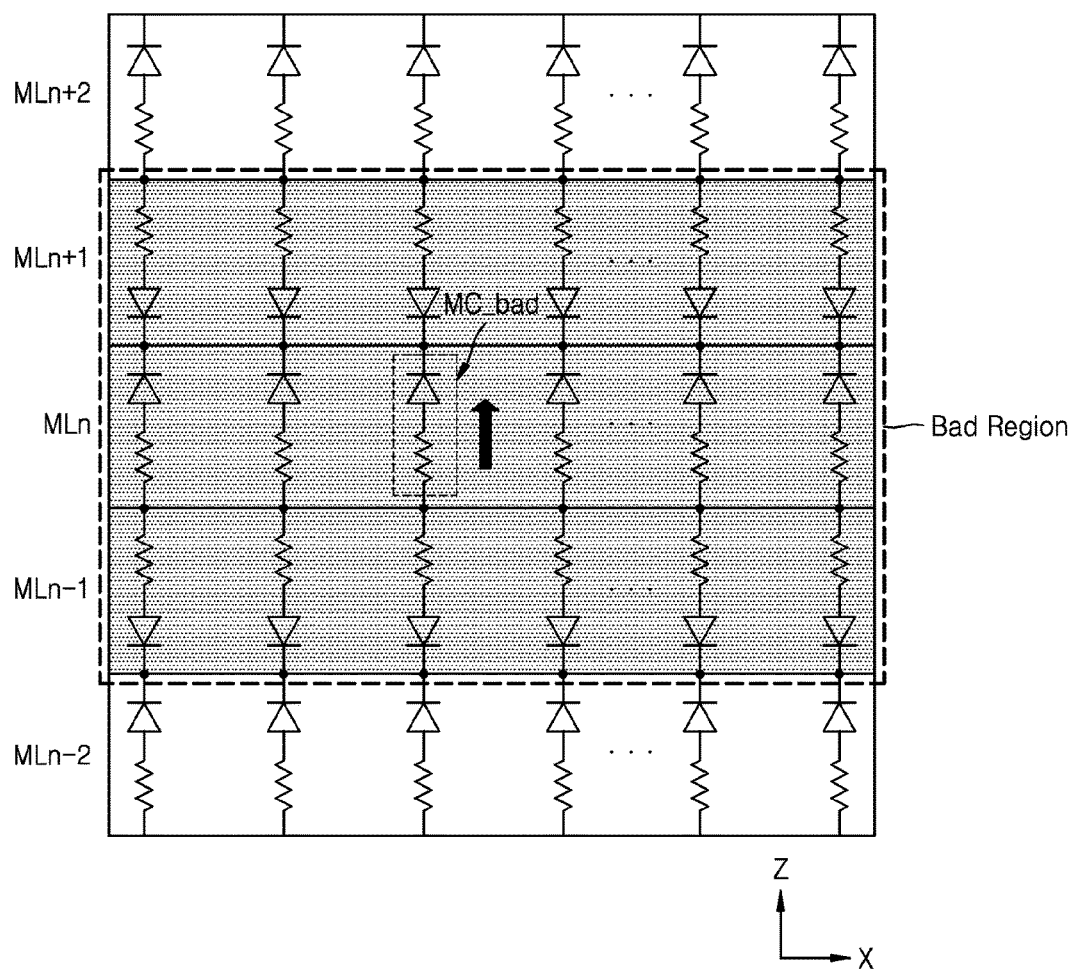

FIGS. 8A and 8B show an example of defining the bad region in the case of the short failure according to an exemplary embodiment of the application.

FIGS. 8A and 8B show plan views in an X-Z plane of the structural view of the memory cell array in FIG. 3A. For the sake of convenience, 5 memory layers are illustrated. In addition, in FIG. 8A, both the bit lines and the word lines, which are connected to both ends of a memory cell, are understood to extend in the X-axis direction, but they are illustrated in this manner to show that the memory layers share a word line and a bit line with each other. It is obvious to those of ordinary skill in the art that the actual bit lines and word lines are disposed orthogonally.

Referring to FIGS. 8A and 8B, the adjacent memory layers from among the memory layers MLn−2 to MLn+2 may share a bit line or a word line. The nth memory layer MLn may share a word line with the upper n+1th memory layer MLn+1 and may share a bit line with the lower n−1th memory layer MLn−1. Here, in the case in which at least one memory cell from among a plurality of memory cells in an nth memory layer MLn is a short-failure cell MC_bad, excess current flows through the short-failure cell MC_bad when the bias voltage is applied to both ends of the memory layer MLn. In this regard, the bad region management unit 131 (see FIG. 7) may define the nth memory layer MLn as the bad region so as to prevent the write or erase operations on the nth memory layer MLn. Here, referring to FIG. 8B, the bad region management unit 131 may define as the bad region the nth memory layer MLn and the upper n+1th and lower n−1th memory layers MLn+1 and MLn−1.

The n+1th memory layer MLn+1 and the n−1th memory layer MLn−1 are normal memory layers that do not include a bad cell MC_bad. However, when the write or read operation is performed to the n+1th memory layer MLn+1 and the n−1th memory layer MLn−1, the bias voltage may also applied to the nth memory layer MLn that shares the word line or the bit line with the n+1th memory layer MLn+1 and the n−1th memory layer MLn−1. Accordingly, by defining as the bad region not only the nth memory layer MLn but also the n+1th memory layer MLn+1 and n−1th memory layer MLn−1, that is, the bad memory layer and the lower and upper layers of the bad memory layer, the bad region management unit 131 may prevent the write and read operations to the bad memory layer, i.e., the nth memory layer MLn, so that the bias voltage is not applied to the bad memory layer, i.e., the nth memory layer MLn.

Figure 9A:
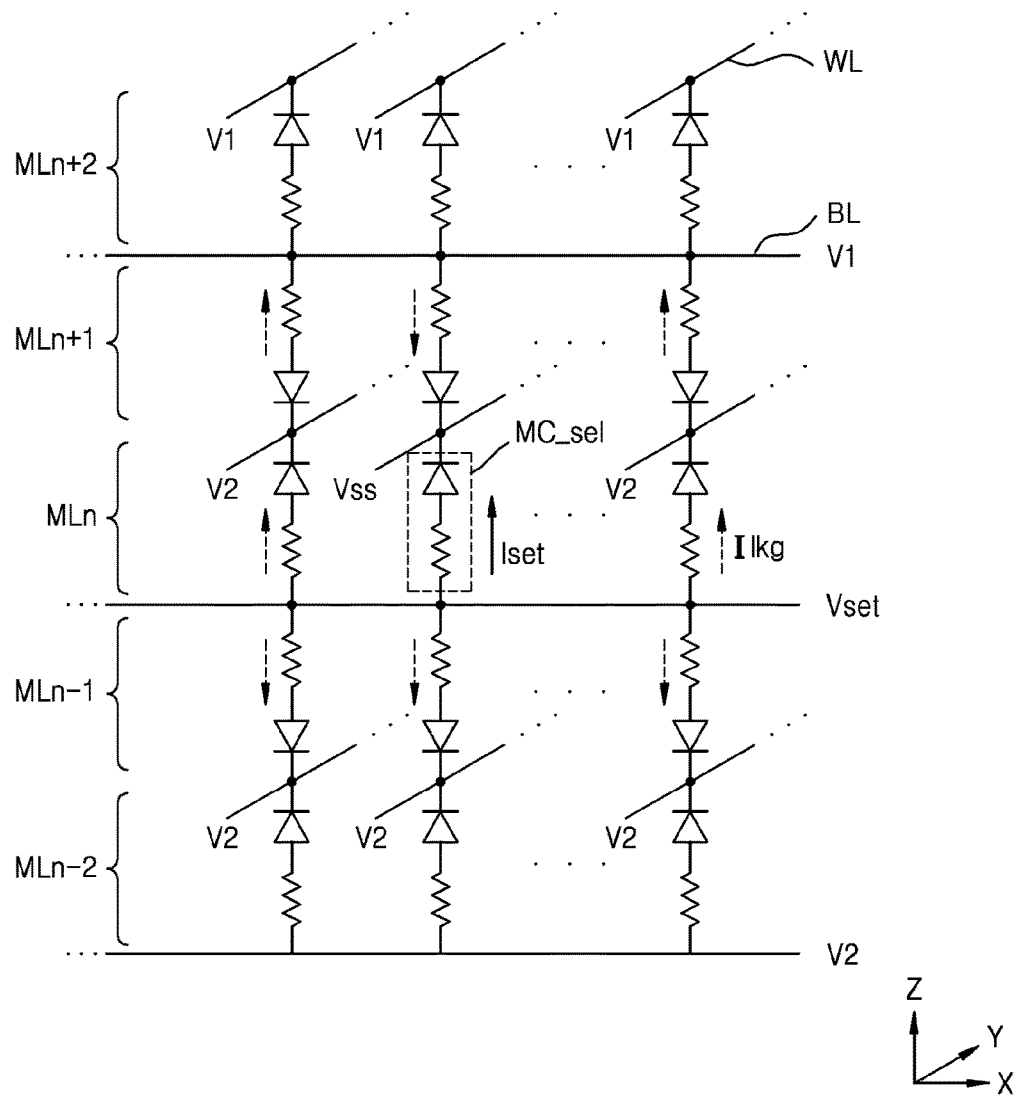
FIGS. 9A and 9B show the bias voltage and the leakage current during the set write operation.
Figure 9B:
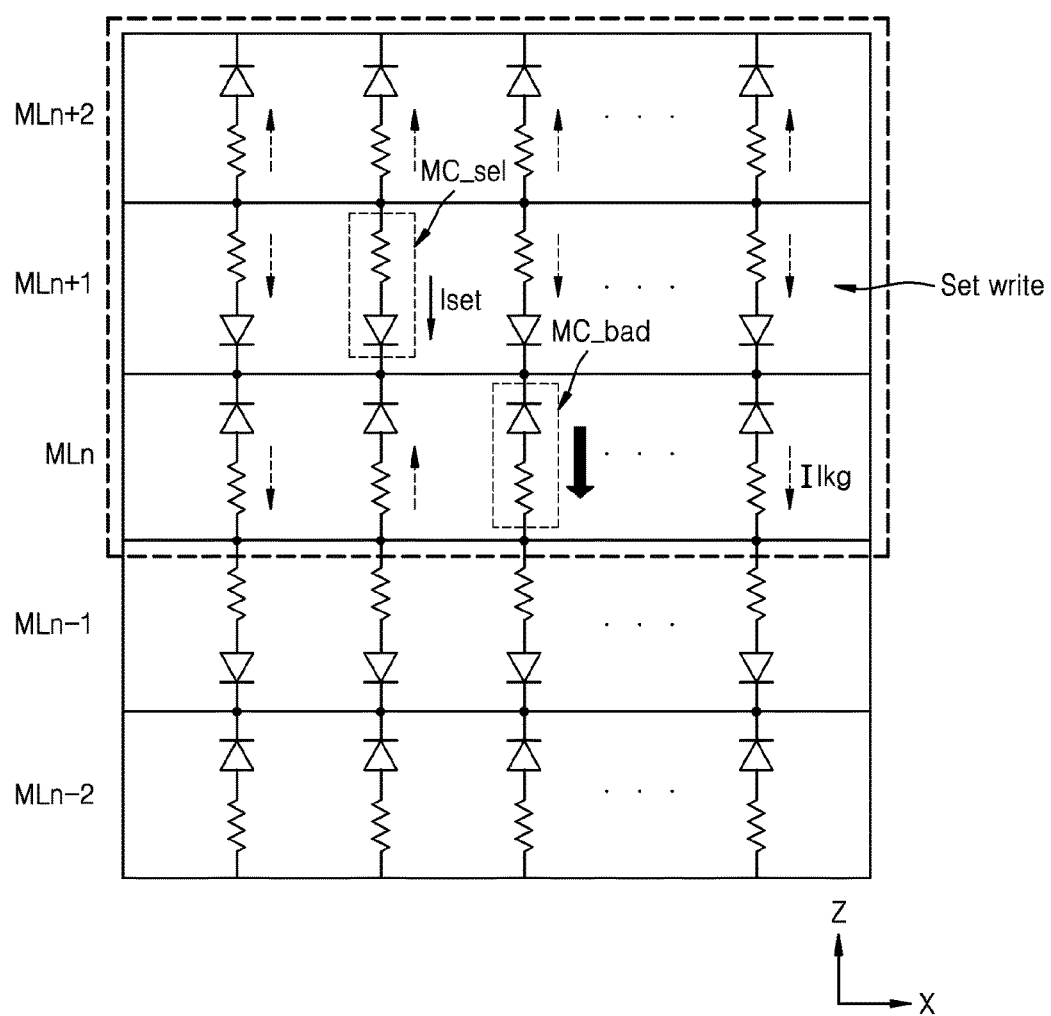

FIGS. 9A and 9B show the bias voltage and the leakage current during the set write operation.

Referring to FIGS. 9A and 9B, during the set write operation, a write set voltage Vset is applied to the bit line that is connected to a selected cell MC_sel, and a ground voltage Vss is applied to the word line. The selected cell MC_sel is forward biased and a diode is turned on, and thus, a set write current Iset may flow. A second voltage V2 may be applied to the word line of other memory cells in the same nth memory layer MLn as the selected cell MC_sel, for example, non-selected memory cells. In this case, the second voltage V2, as an inhibit voltage, may be greater than the ground voltage Vss and lower than the set write voltage Vset to prevent the non-selected memory cells from being programmed. The non-selected memory cells are forward biased but the difference in voltage levels between the second voltage V2 and the set write voltage Vset is lower than a turn-on threshold voltage of the diode. Therefore, the set write current Iset may not flow in the non-selected memory cells, but a leakage current Ilkg may flow therein. Moreover, although all of the non-selected memory cells in the nth memory layer MLn are illustrated to be forward biased in FIG. 9A, a non-selected memory cell (not shown) that does not share the bit line with the selected memory cell MC_sel may be forward biased when a first voltage V1, which is lower than the second voltage V2, is applied thereto. In this case, the first voltage V1, as the inhibit voltage, may be lower than the set write voltage Vset and the second voltage V2 and may be greater than the ground voltage Vss.

In addition, in the case of the n+1th memory layer MLn+1, the second voltage V2 or the ground voltage Vss may be applied to the word line of a memory cell, and the first voltage V1 may be applied to the bit line. Some of the memory cells of the n+1th memory layer MLn+1 may be forward biased, and other memory cells thereof may be reverse biased to let the leakage current flow therethrough.

In the case of the n−1th memory layer MLn−1, the set write voltage Vset may be applied to the bit line of a memory cell, and the second voltage V2 may be applied to the word line. The memory cell may be forward biased to let the leakage current flow therethrough.

Moreover, in the case of the n+2th memory layer MLn+2, the first voltage V1 is applied to both the bit line and the word line of a memory cell, and thus, there may be no difference in voltages at the both ends of the memory cell. In the case of the n−2th memory layer MLn−2, the second voltage V2 is applied to both the bit line and the word line of a memory cell, and thus, there may be no difference in voltages at the both ends of the memory cell As described above, when the set write operation is performed to a memory layer, memory cells of an adjacent memory layer may be forward or reverse biased to let the leakage current flow therethrough. As illustrated in FIG. 9B, when the set write operation is performed on the selected memory cell MC_sel in the n+1th memory layer MLn+1, not only the n+1th memory layer MLn+1 but also the nth memory layer MLn and the n+2th memory layer MLn+2 may also be biased. In this case, since the nth memory layer MLn has the short-failure cell MC_bad, the leakage current may be abnormally increased through the short-failure cell MC_bad.

However, based on the defining method described above according to an exemplary embodiment, the bad memory layer including the short-failure cell MC_bad, for example, the nth memory layer MLn, and the lower and upper layers of the bad memory layer, for example, the n−1th memory layer MLn−1 and the n+1th memory layer MLn+1 in FIG. 9B are defined as the bad region, and then read and write operations thereto are prevented so that the bias voltage may not be applied to the bad memory layer.

Figure 10A:
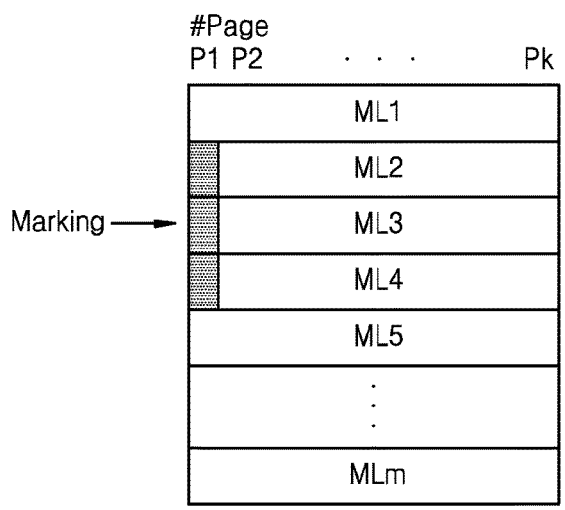
FIGS. 10A and 10B show methods of marking the bad region, according to one or more exemplary embodiments of the application.
Figure 10B:
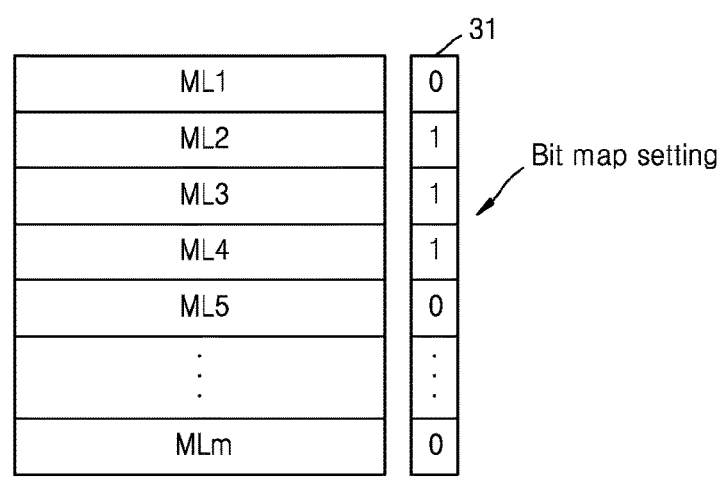

FIGS. 10A and 10B show methods of marking the bad region, according to one or more exemplary embodiments of the application. As illustrated in FIG. 10A, the bad region defining unit 11 (see FIG. 7) may mark some portions of a page in each of the memory layers with a predetermined pattern to denote that the memory layer is the bad region. In addition, as illustrated in FIG. 10b, the bad region defining unit 11 uses predetermined cells of the memory layer as a bit map 31 and may mark the memory layer as the bad region by setting the cells. For example, if a cell bit is set to "1", it may mean that the memory layer belongs to a bad region, and if the cell bit is set to "0", it may mean that the memory layer belongs to a normal region. In an exemplary embodiment, the bit map 31 may be independently stored in the information storage unit 13 (see FIG. 7), the memory controller 200 (see FIG. 1), or the like. In an exemplary embodiment, the predetermined cells are the regions that are pre-allocated to store information on the memory layer and may be embodied in an independent physical form to be different from other memory cells of the memory layer. In this regard, by marking some portions of the memory layer defined as the bad region as the bad region, the information on the bad region may be reconstructed by reading some portions of the memory layer, for example some portions of the page or the memory cell even when the information on the bad region, stored in the information storage unit 13, is lost.

Figure 11A:
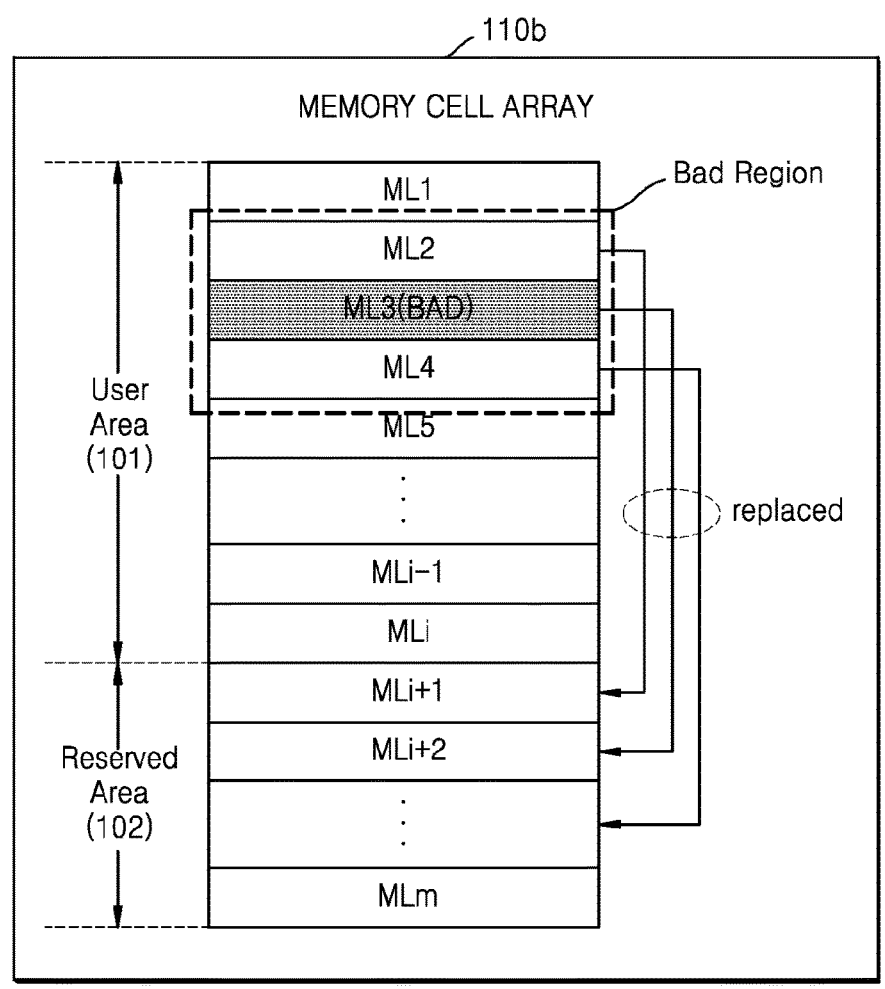

FIGS. 11A and 11B show methods of replacing the memory layer of the bad region. Referring to FIG. 11A, a memory cell array 110b may include a plurality of memory layers ML1 to MLm. Also, the memory cell array 110b may include a user area 101 in which user data is stored and a reserved area 102 with which some portions of the memory layer in the user area are replaced. In an exemplary embodiment, the user area 101 and the reserved area 102 may be included in an identical tile. In another exemplary embodiment, the memory cell array 110b may include a plurality of tiles, and the reserved area 102 may be included in another tile in which the user area 101 is not included.

When the short failure occurs in the memory layer of the user area 101, the bad region defining unit 11 (see FIG. 7) may replace the bad memory layer, including the bad cell, and two adjacent memory layers with memory layers in the reserved area 102. For example, a third memory layer ML3, a second memory layer ML2, and a fourth memory layer ML4 may be replaced with i+1th to i+3th memory layers MLi+1 to MLi+3 in the reserved area 102. In addition, as illustrated in FIG. 11B, a map table 32 showing a corresponding relationship between the memory layer in the bad region and the replacement memory layer may be prepared. The map table 32 may be updated whenever a bad region is added. In the current exemplary embodiment, although three consecutive memory layers MLi+1 to MLi+3, which are adjacent memory layers, are illustrated to replace the memory layers in the bad region, the application is not limited thereto. The replacement memory layers in the reserved area 102 may not be consecutive layers.

Figure 12:
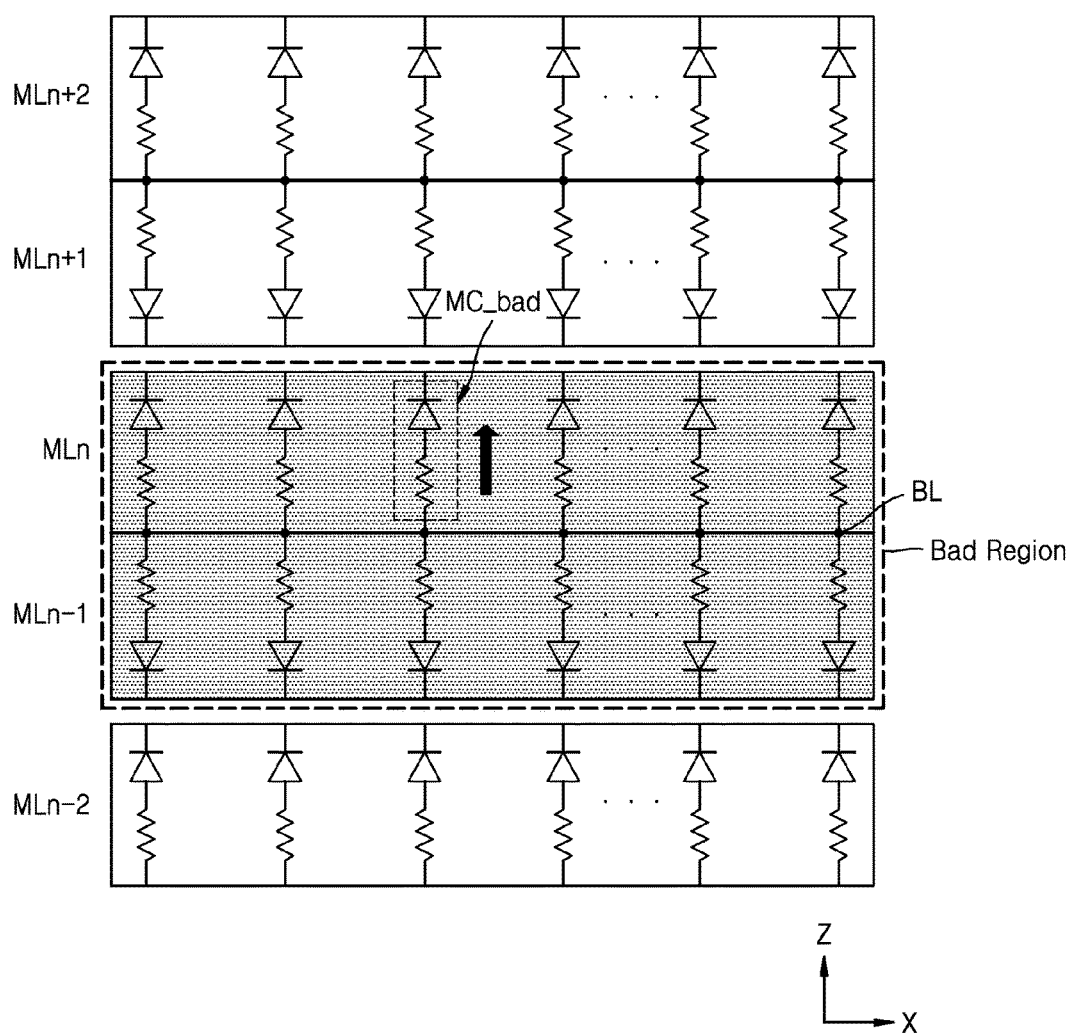
FIG. 12 shows a method of defining the bad region regarding the short failure, according to another exemplary embodiment of the application.

FIG. 12 shows a method of defining the bad region regarding the short failure, according to another exemplary embodiment of the application.

Referring to FIG. 12, each of memory layers MLn−2 to MLn+2 may share one of the bit line or the word line with an adjacent memory layer and may be physically separated from other adjacent memory layers. For example, as illustrated in the drawing, an n+1th memory layer MLn+1 shares the bit line BL with an n+2th memory layer MLn+2 and may be physically separated from an nth memory layer MLn. An n−1th memory layer MLn−1 may share the bit line BL with the nth memory layer MLn and may be physically separated from an n−2th memory layer MLn−2. An insulating layer (not shown) may be disposed between the memory layers that are physically separated from each other. For example, an oxide layer may be disposed between the nth memory layer MLn and the n+1th memory layer MLn+1, and between the n−2th memory layer MLn−1 and the n−1th memory layer MLn−1. Although the memory layers MLn−2 to MLn+2 are illustrated to share the bit line with the adjacent memory layers in FIG. 12, the application is not limited thereto. A word line may be shared between the adjacent memory layers.

In the current exemplary embodiment, when the short failure occurs in the memory layer, the memory layer in which the short failure occurs, and the other memory layer that shares the bit line or the word line with the memory layer having a failure may be defined as the bad region. For example, as illustrated in the drawing, when the short failure occurs in the short-failure cell MC_bad of the nth memory layer MLn, the nth memory layer MLn and the n−1th memory layer MLn−1 may be defined as the bad region.

Figure 13:
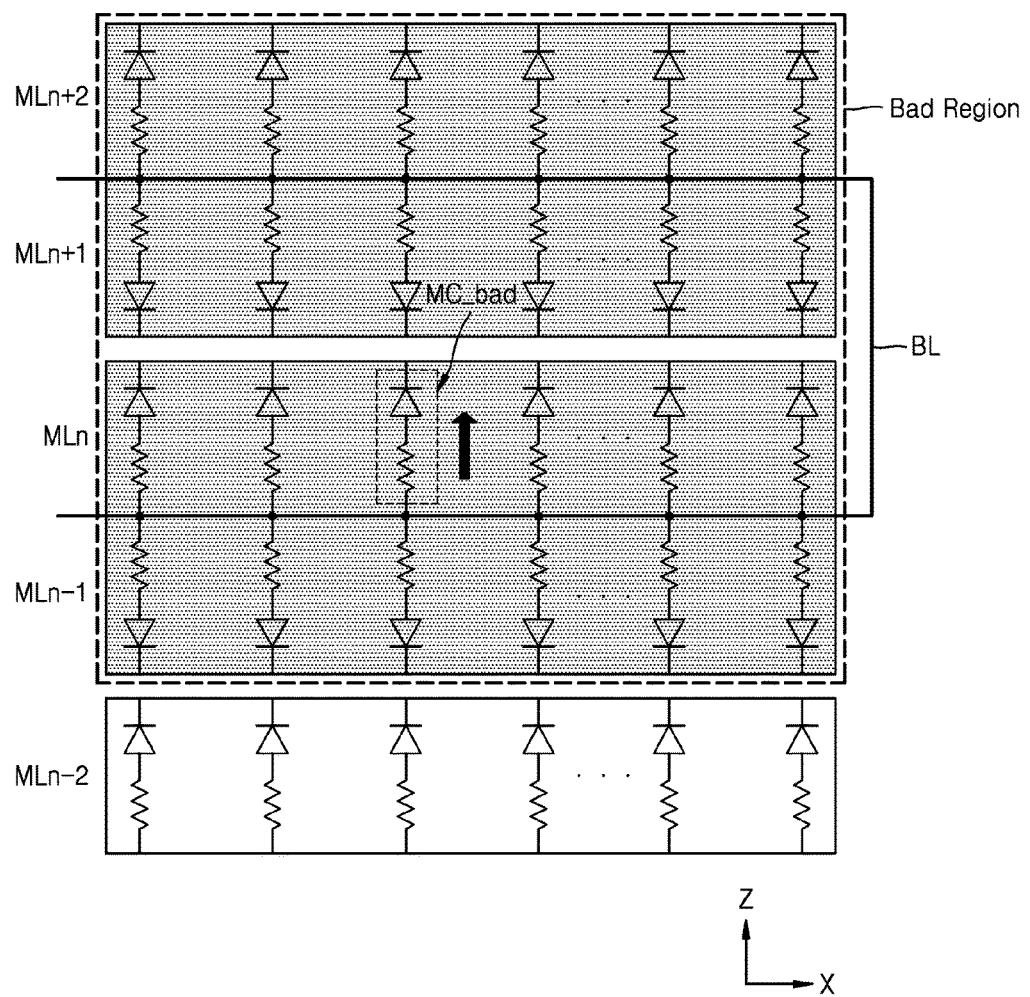
FIG. 13 shows a method of defining the bad region regarding the short failure, according to another exemplary embodiment of the application.

FIG. 13 shows a method of defining the bad region regarding the short failure, according to another exemplary embodiment of the application.

Referring to FIG. 13, memory layers MLn−2 to MLn+2 may share one of the bit lines or the word lines and may be physically separated from the other adjacent memory layers. Alternatively, the memory layers MLn−2 to MLn+2 may share the bit line or the word line not only with an adjacent memory layer but also with at least one selected from memory layers that are physically separated therefrom. As illustrated in FIG. 13, n−1th to n+2th memory layers MLn−1 to MLn+2 may all share the bit line BL. In this regard, when the short failure occurs in the short-failure cell MC_bad of the nth memory layer MLn, the n−1th to n+2th memory layers MLn−1 to MLn+2 that share the bit line may be defined as the bad region.

Figure 14:
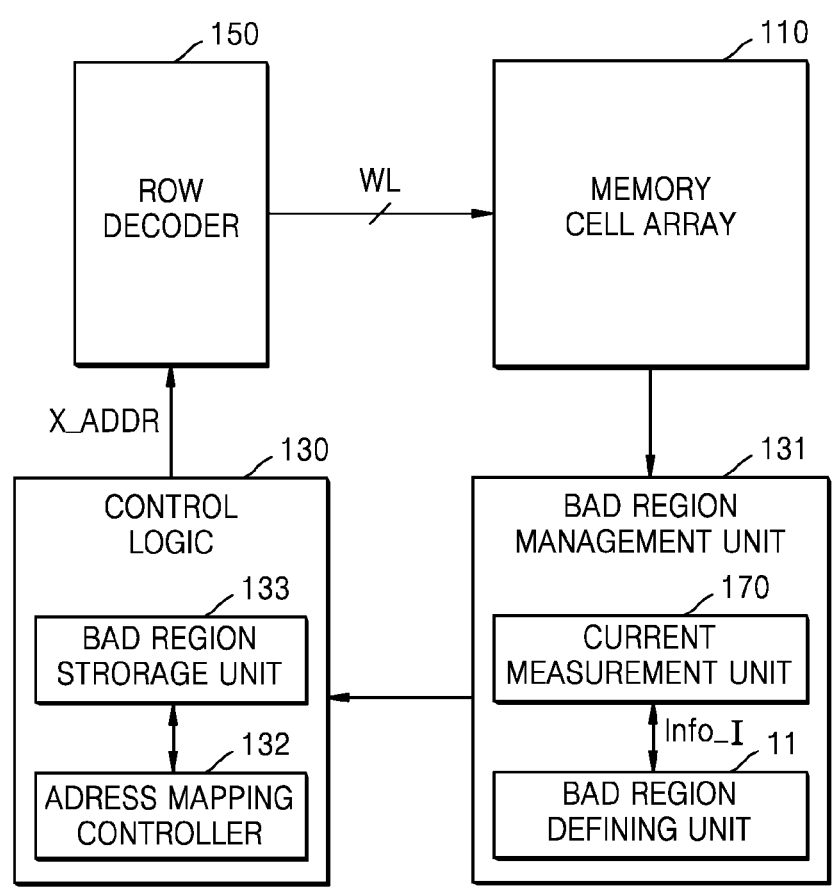
FIG. 14 is a block diagram showing another example of the memory device according to an exemplary embodiment of the application.

FIG. 14 is a block diagram showing another example of the memory device according to an exemplary embodiment of the application. Like elements in FIG. 14 and in the memory device 100 of FIG. 2 perform the same or like functions, and thus the detailed description will not be repeated.

Referring to FIG. 14, the bad region management unit 131 may be embodied in an independent module. The bad region management unit 131 may include the current measurement unit 170 and the bad region defining unit 11. In an exemplary embodiment, the bad region management unit 131 may be embodied by hardware or software, but an exemplary embodiment is not limited thereto.

The current measurement unit 170 may measure the amount of current Info_I flowing through the memory cell array 110 and provide the bad region defining unit 11 with the amount of current Info_I. The bad region defining unit 11 may determine the type of the failure based on the amount of current Info_I and may define the bad region based on the type of the failure. The method of defining the bad region was described by referring to FIG. 8, and thus, the detailed descriptions thereof will not be repeated. The bad region defining unit 11 may provide the control logic 130 with information on the bad region.

In addition, a control logic 130 may include an address mapping controller 132 and a bad region storage unit 133. When the information on the bad region is stored in the bad region storage unit 133 and the address mapping controller 132 receives an access request to the bad region from an external source, the address mapping controller 132 may provide the row decoder 150 or the column decoder 160 with an address corresponding to a replacement memory layer.

Figure 15:
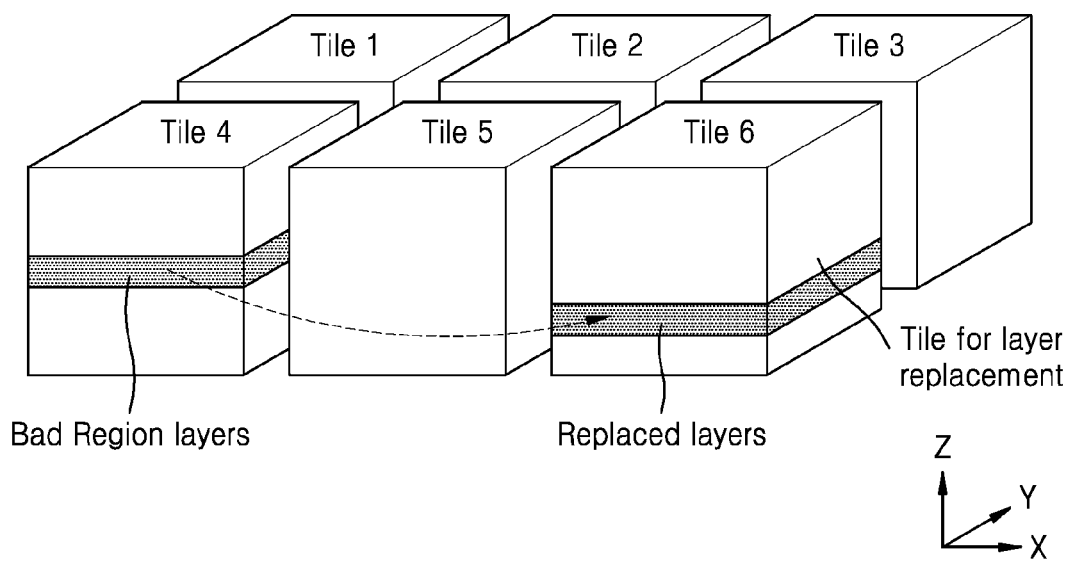
FIG. 15 is a block diagram showing a method of replacing the bad region when a plurality of tiles are included in the memory cell array, according to an exemplary embodiment of the application.

FIG. 15 is a diagram showing a method of replacing the bad region when a plurality of tiles are included in the memory cell array, according to an exemplary embodiment of the application.

Referring to FIG. 15, a memory cell array 110c may include a plurality of tiles. As illustrated in the drawing, each of the tiles may include a plurality of memory layers stacked in the vertical direction. At least one of the tiles, for example a sixth tile Tile 6, may be a reserved tile used to replace the memory layer in the bad region. When some portions of other tiles Tile 1 to Tile 5, for example, memory layers in the fourth tile Tile 4, are defined as the bad region, the memory layers in the bad region may be replaced with memory layers in the sixth tile Tile 6. In an exemplary embodiment, the address mapping controller 12 (see FIG. 7) may translate an address by altering at least one bit value from among a plurality of bit values that determine the address.

Figure 16:
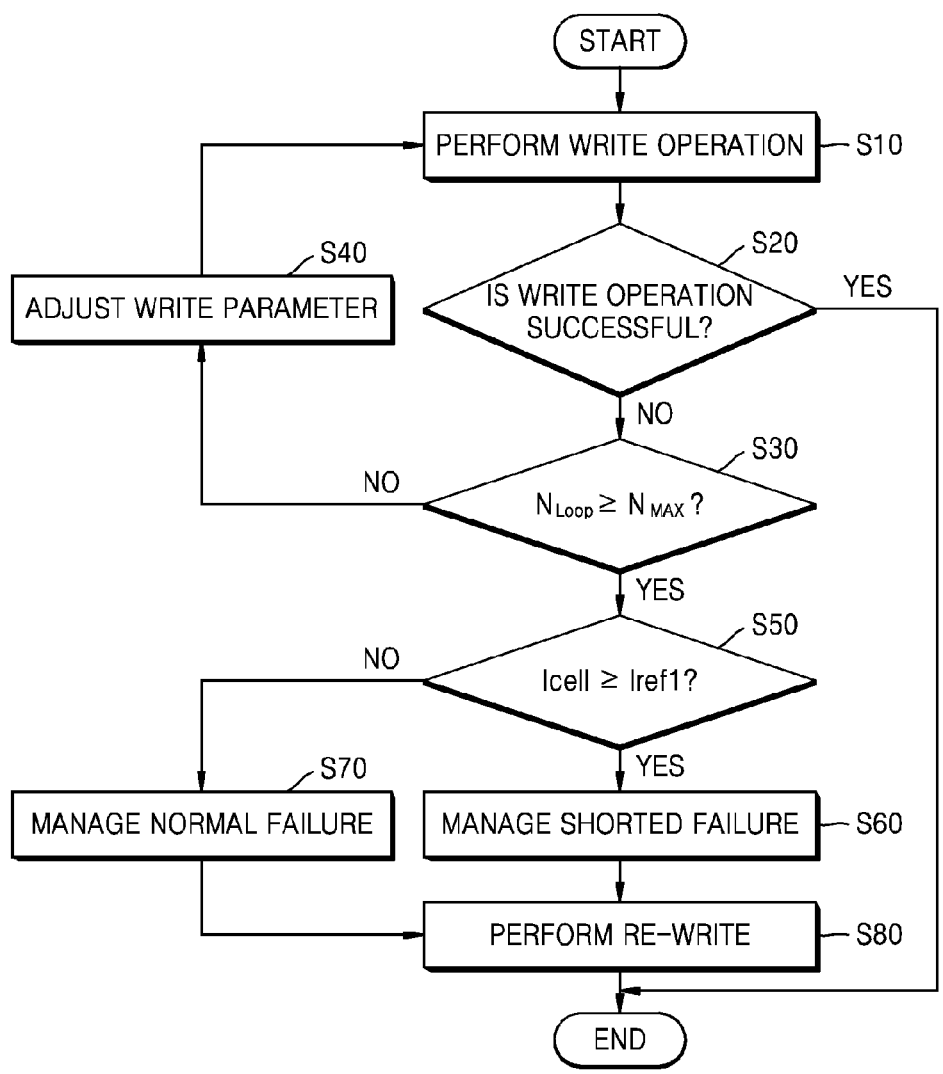
FIG. 16 is a flowchart of a method of operating a memory device, according to an exemplary embodiment of the application.

FIG. 16 is a flowchart of a method of operating a memory device, according to an exemplary embodiment of the application.

Referring to FIG. 16, a write command and data are received, and a write operation is performed (S10). After performing the write operation, whether the write operation is successful is determined (S20). For a memory cell, on which the write was performed, whether or not the write operation is successful may be determined by performing a write verification operation.

If the write operation is not successful, it is determined whether the number of repetitions of performing the write operation is equal to or greater than a pre-set maximum value (S30). If the number of repetitions of performing the write operation NLoop is less than a pre-set maximum value NMAX, a write parameter is adjusted (S40) and the write operation is repeated. For example, a voltage or the amount of current of a write pulse may be increased to perform a normal write operation.

Otherwise, if the number of repetitions of performing the write operation NLoop is equal to or greater than the pre-set maximum value NMAX, it is assumed that a failure occurs and a type of the failure is determined (S50). The type of the failure may be determined by measuring the amount of a cell current Icell flowing through the memory cell. If the cell current Icell is equal to or greater than a pre-set first reference value Iref1, it is assumed that a short failure occurs. Otherwise, if the cell current Icell is less than the first reference value Iref1, it is assumed that a non-short failure occurs. In an exemplary embodiment, the first reference value Iref1 may be set based on the amount of current flowing in the memory cell when the memory cell is in the lowest resistance state. The first reference value Iref1 may be set to have a higher value than the amount of current that flows in the memory cell in the lowest resistance state.

If the failure in the memory cell is determined to be the short failure, a short failure management is performed (S60). Otherwise, if the failure in the memory cell is determined to be the non-short failure, a non-short failure management is performed (S70). In the performing of the short failure management (S60), not only the memory layer where the failure occurs but also at least one adjacent memory layer may be defined as a bad region, and a read and write operation to the bad region may be blocked. In the performing of the non-short failure management (S70), the memory layer where the failure occurs may be defined as the bad region.

When the short failure occurs, if a bias voltage is applied to the memory layer where the failure occurs, an abnormal leakage current flows. To prevent the abnormal leakage current, in the performing of the short failure management, the memory layer where the failure occurs and an adjacent memory layer are defined as the bad region to prevent applying a forward or reverse bias voltage thereto. Alternatively, in the case of the non-short failure, the memory layer where the failure occurs does not affect and is not affected by an operation of other memory layers. Therefore, in the case of the non-short failure, the memory layer where the failure occurs may only be defined as the bad region.

After that, data that failed to be written may be re-written to normal memory layers which are the memory layers except for the memory layers defined as the bad region. (S80)

In the current exemplary embodiment, if the failure occurs in the memory cell, the type of the failure is determined based on the current flowing in the memory cell, and a bad region management is performed based on the type of the failure to secure as many memory cells as possible to normally operate. In addition, in the case of the short failure, the bad region is defined by considering a method of applying a bias to a memory cell array stacked in the vertical direction, or the like so that an increase in the leakage current may be prevented.

Figure 17:
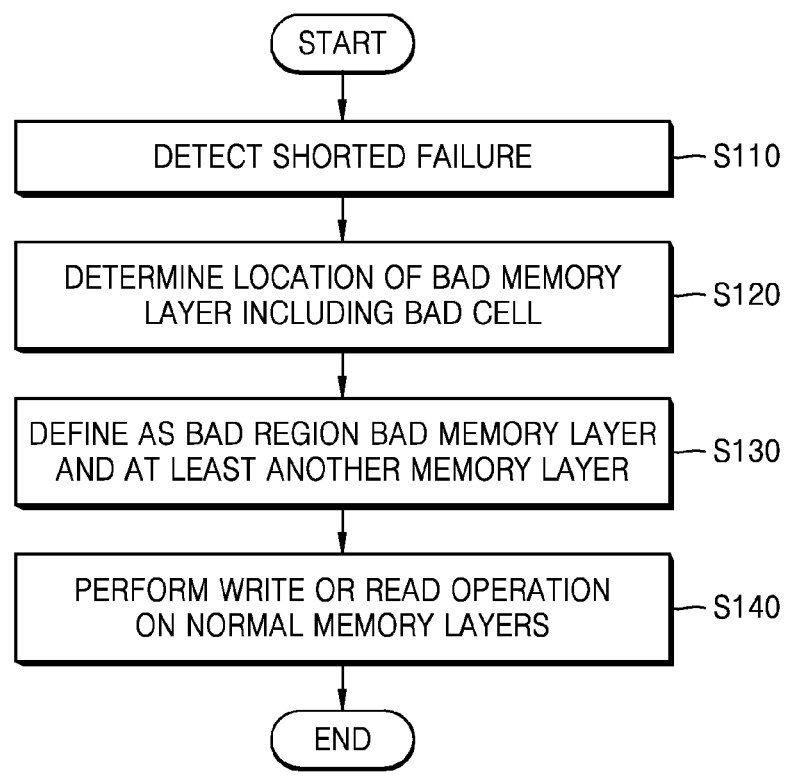
FIG. 17 is a flowchart of a method of operating a memory device, according to another exemplary embodiment of the application.

FIG. 17 is a flowchart of a method of operating a memory device, according to another exemplary embodiment of the application.

Referring to FIG. 17, once it is detected that the short failure occurs (S110), a location of a bad memory layer including a bad cell is determined (S120) In an exemplary embodiment, whether or not the short failure occurs may be determined by measuring the amount of current flowing through the memory cell or a memory cell array. If the measured amount of current is greater than the amount of current flowing in the memory cell in the first resistance state RS1, that is, the lowest resistance state, it is determined that the short failure occurs. In another exemplary embodiment, values of inhibit voltages applied to the memory cell array, for example, the column inhibit voltage (Vihby) and the row inhibit voltage (Vihbx), are measured, and then if a difference between the measured voltage values and a target voltage value is equal to or greater than a pre-set threshold value, it is determined that the short failure occurs.

After that, the bad memory layer and at least one adjacent memory layer are defined as the bad region. (S130) In an exemplary embodiment, the at least one adjacent memory layer may be a memory layer adjacent to an upper surface and a lower surface of the bad memory layer. In another exemplary embodiment, the at least one adjacent memory layer may be a memory that shares a bit line or a word line with the bad memory layer. In another exemplary embodiment, the at least one adjacent memory layer may be a memory layer to which at least two common bias voltages, from among the bias voltages applied to the bad memory layer, are applied.

The write or read operation is performed to the other memory layers that are not defined as the bad region, which are the normal memory layers. (S140). If an access request to the memory layers defined as the bad region is received, the other normal memory layers may be alternatively provided.

Figure 18:
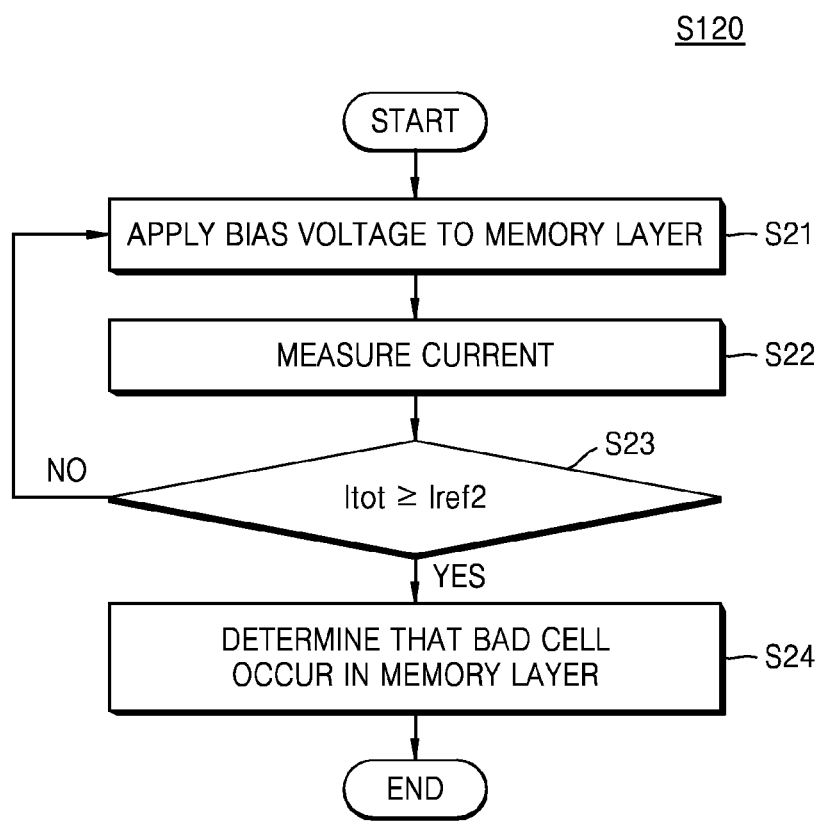
FIG. 18 is a flowchart of an operation of determining the location of a bad memory layer in FIG. 17.

FIG. 18 is a flowchart of an operation (S120) of determining the location of the bad memory layer in FIG. 17.

Referring to FIG. 18, the bias voltage is applied to the memory layer in operation (S21). In an exemplary embodiment, the bias voltage may be a bias voltage for the read operation. In another exemplary embodiment, the bias voltage may be a forward or reverse bias voltage that is uniformly applied to the memory cell in at least some of the memory layers.

The amount of current flowing in the memory cell Itot is measured (S22), and the measured amount of current Itot is compared with a second reference value Iref2 (S23). In an exemplary embodiment, the second reference value Iref2 may be a pre-set value considering a characteristic of the operation of the memory device. In another exemplary embodiment, the second reference value Iref2 may be set considering the applied bias voltage, the number of cells to which the bias voltage is applied, or the like.

If the measured amount of current Itot is less than the second reference value Iref2, it is determined that the biased memory layer is not the memory layer including the bad cell, and then, the above process may be applied to the other memory layers.

Otherwise, if the measured amount of current Itot is equal to or greater than the second reference value Iref2, it is determined that the short failure occurs in the cell of the biased memory layer (S24), and then, the address of the memory layer may be obtained.

Figure 19:
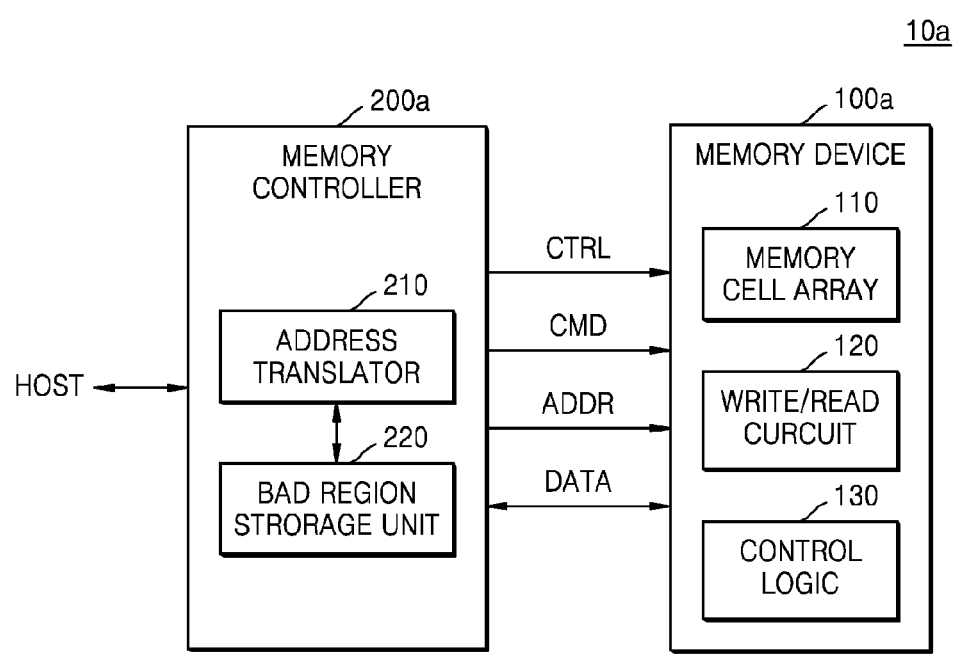
FIG. 19 is a block diagram showing a memory system including a resistive memory device, according to another exemplary embodiment of the application.

FIG. 19 is a block diagram showing a memory system 10a including a memory device 100a, according to another exemplary embodiment of the application.

Like components and reference numerals in FIGS. 1 and 19 denote like or the same components and functions, and thus, the descriptions thereof will not be repeated.

Referring to FIG. 19, a memory controller 200a may include an address translator 210 and a bad region storage unit 220. The address translator 210 may translate the logical address received from the host to the physical address of the memory device 100a. The bad region storage unit 220 may receive information on the memory layer defined as the bad region from the memory device 100a and store the information. An access to the memory layer defined as the bad region needs to be blocked. In this regard, when translating the received logical address to the physical address, the address translator 210 may provide the physical address of the other memory layers that are not defined as the bad region based on the information of the bad region storage unit 220.

Figure 20:
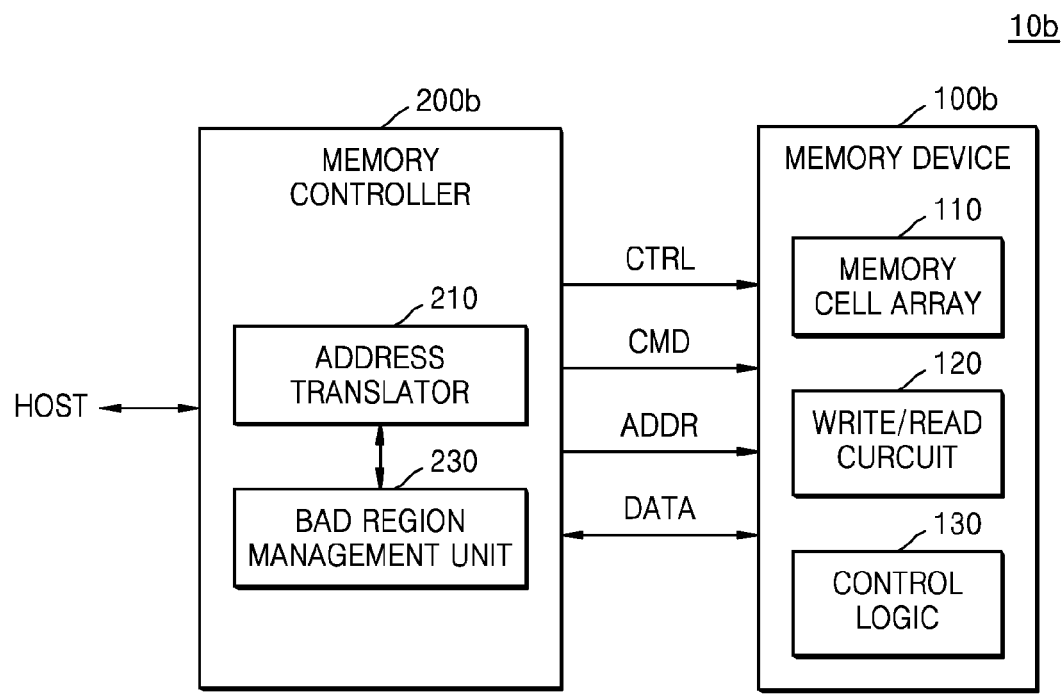
FIG. 20 is a block diagram showing a memory system including a resistive memory device, according to another exemplary embodiment of the application.

FIG. 20 is a block diagram showing a memory system 10b including a memory device 100b, according to another exemplary embodiment of the application.

Like components and reference numerals in FIGS. 1 and 20 denote like or the same components and functions, and thus, the descriptions thereof will not be repeated.

Referring to FIG. 20, a memory controller 200b may include the address translator 210 and a bad region management unit 230. The address translator 210 may translate the logical address received from the host to the physical address of the memory device 100b. The memory device 100b provides the bad region management unit 230 with the amount of current flowing in the memory cell, and thus, the bad region management unit 230 may define the bad region based on the measured amount of current. The bad region management unit 230 may determine the type of the failure, for example, the short failure or the non-short failure, based on the amount of current; change the management method for the bad region based on the type of the failure; and provide a command CMD marking the memory layer defined as the bad region as the bad region, and an address ADDR. Also, the bad region management unit 230 may operate to replace the memory layer defined as the bad region with another memory layer. When the address translator 210 translates the logical address to the physical address, the address translator 210 may provide the address of the memory layer, except for the memory layer defined as the bad region, as the physical address corresponding to the logical address.

Figure 21:
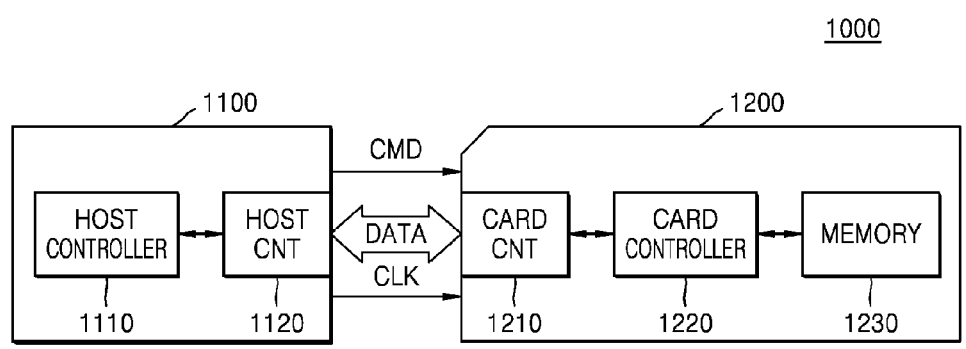
FIG. 21 is a block diagram of a memory card system having a memory system according to an exemplary embodiment of the application applied thereto, according to an exemplary embodiment of the application.

FIG. 21 is a block diagram of a memory card system 1000 having a memory system according to an exemplary embodiment of the application applied thereto, according to an exemplary embodiment of the application.

Referring to FIG. 21, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the exemplary embodiments described with reference to FIGS. 1 to 20.

The host 1100 may write data to the memory card 1200 or may read data stored in the memory card 1200. The host controller 1110 may provide a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1200 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory.

Figure 22:
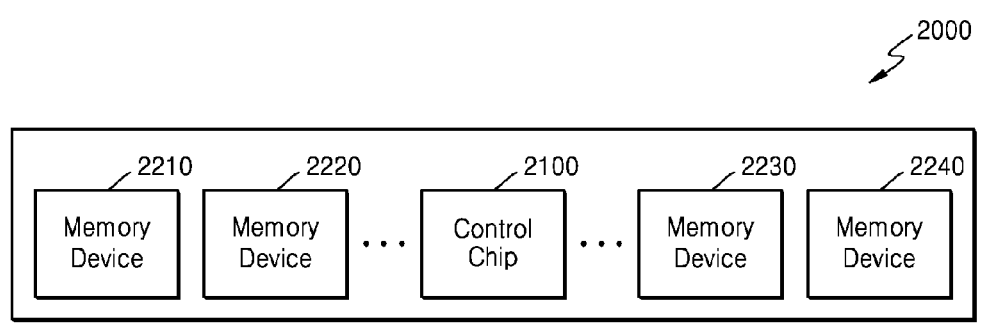
FIG. 22 illustrates a resistive memory module according to an exemplary embodiment of the application.

FIG. 22 illustrates a resistive memory module 2000 according to an exemplary embodiment of the application. Referring to FIG. 22, the resistive memory module 2000 may include memory devices 2210 to 2240, and a control chip 2100. Each of the memory devices 2210 to 2240 may be embodied by using the exemplary embodiments described with reference to FIGS. 1 to 20. In response to various signals transmitted from an external memory controller, the control chip 2100 may control the memory devices 2210 to 2240. For example, according to various commands and addresses that are transmitted from an external source, the control chip 2100 may activate the memory devices 2210 to 2240 corresponding to the various commands and addresses, and thus, may control write and read operations. Also, the control chip 2100 may perform various post processing operations on read data output from each of the memory devices 2210 to 2240, e.g., the control chip 2100 may perform error detection and correction operations on the read data.

According to an exemplary embodiment of the application, the memory devices 2210 to 2240 may determine the type of the failure when the failure occurs in the memory cell array stacked in the vertical direction and perform a bad region management corresponding thereto. The memory devices 2210 to 2240 may measure the amount of current flowing in the memory cell and determine the type of the failure based on the measured amount of current. In the case of the short failure, the memory layer where the failure occurs and at least one adjacent memory layer may be defined as the bad region, whereas, in the case of the non-short failure, the memory layer where the failure occurs may be defined as the bad region.

Figure 23:
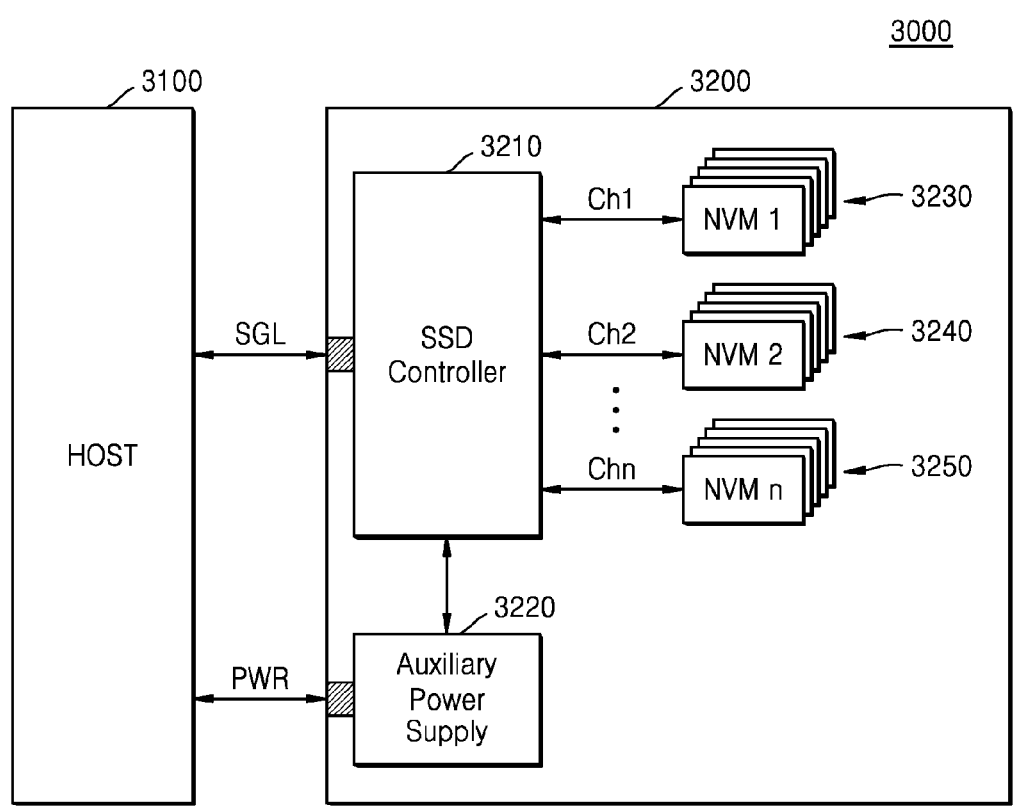
FIG. 23 is a block diagram of a solid state disk (SSD) system including a memory system according to an exemplary embodiment of the application applied thereto, according to an exemplary embodiment of the application.

FIG. 23 is a block diagram of an SSD system 3000 including a memory system according to an exemplary embodiment of the application applied thereto, according to an exemplary embodiment of the application.

Referring to FIG. 23, the SSD system 3000 may include a host 3100 and an SSD 3200. The SSD 3200 exchanges signals SGL with the host 3100 via a signal connector and may receive power PWR input from a power connector. The SSD 3200 includes an SSD controller 3210, an auxiliary power supply 3220, and a plurality of memory devices 3230, 3240, and 3250. Here, the SSD 3200 may be embodied by using the exemplary embodiments of FIGS. 1 to 18.

Figure 24:
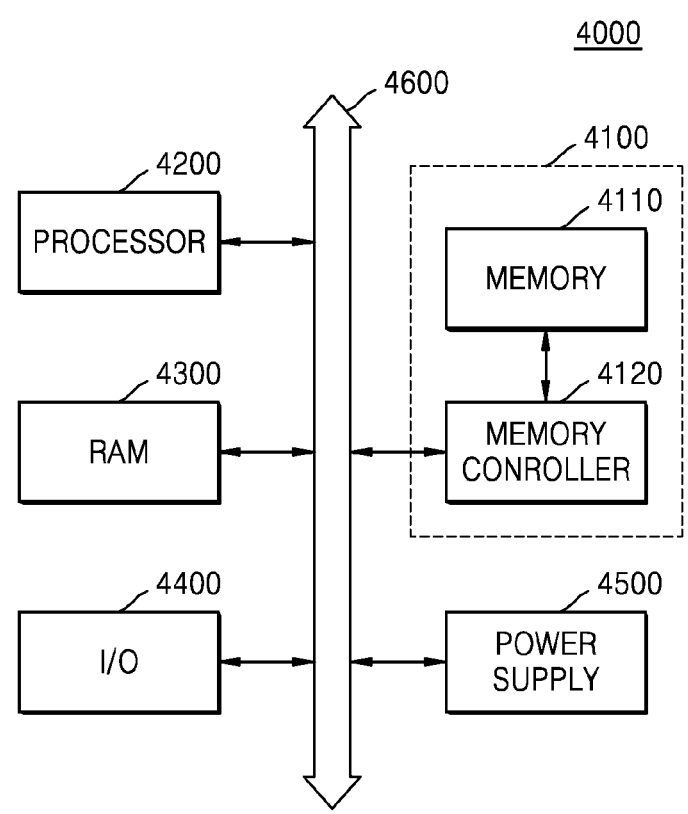
FIG. 24 is a block diagram of a computing system including a memory system according to an exemplary embodiment of the application.

FIG. 24 is a block diagram of a computing system 4000 including a memory system according to an exemplary embodiment of the application.

Referring to FIG. 24, the computing system 4000 may include a memory system 4100, a processor 4200, RAM 4300, an input/output (I/O) device 4400, and a power supply device 4500. Although not illustrated in FIG. 24, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The memory system 4100 may include a memory 4110 and a memory controller 4120, such as those described herein.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may be embodied by using the exemplary embodiments described with reference to FIGS. 1, 19, and 20.

In one or more exemplary embodiments, the processor 4200 may also be connected to an extended bus such as a Peripheral Component Interconnect (PCI) bus.

The RAM 4300 may store data for operations of the computing system 4000. For example, the RAM 4300 may be embodied as DRAM, mobile DRAM, SRAM, PRAM, FRAM, RRAM and/or MRAM.

The I/O device 4400 may include an input unit such as a keyboard, a keypad, or a mouse, and an output unit such as a printer or a display. The power supply device 4500 may supply an operating voltage for the operations of the computing system 4000.

While the application has been particularly shown and described with reference to exemplary embodiments thereof, it will be understood that various changes in form and details may be made therein without departing from the spirit and scope of the following claims.

What is claimed is:

1. A resistive memory device comprising:
   a memory cell array comprising a plurality of memory layers stacked in a vertical direction, wherein each of the plurality of memory layers comprises a plurality of memory cells disposed in regions where a plurality of first lines and a plurality of second lines cross each other, and
   a bad region management unit that defines as a bad region a first memory layer, comprising a bad cell from among the plurality of memory cells, and second memory layers, one of the second memory layers disposed adjacent to an upper surface of the first memory layer and another of the second memory layers disposed adjacent to a lower surface of the first memory layer.

2. The resistive memory device of claim 1, wherein the bad cell comprises a memory cell where a short failure occurs, and in the case of the short failure, a current that is more than a pre-set reference value flows when a bias voltage is applied at both ends of the memory cell.

3. The resistive memory device of claim 1, wherein the second memory layers do not comprise the bad cell.

4. The resistive memory device of claim 1, wherein the second memory layers share at least one selected from the first line and the second line with the first memory layer.

5. The resistive memory device of claim 1, wherein at least two bias voltages, from among bias voltages, are applied to the second memory layers, when the bias voltages are applied to the first memory layer.

6. The resistive memory device of claim 1, wherein the bad region management unit marks, in each of the first and second memory layers, the first and second memory layers as bad regions.

7. The resistive memory device of claim 1, wherein the bad region management unit comprises:
   a bad region storage unit that stores information of the bad region; and
   an address mapping controller that translates an input address to an address corresponding to a normal region when the input address, which is input from the outside, corresponds to the bad region.

8. The resistive memory device of claim 7, wherein the address mapping controller translates the input address to an address corresponding to at least another memory layer within a tile including the bad region.

9. The resistive memory device of claim 8, wherein the memory cell array comprises:
   N memory tiles (where N is a natural number greater than 2) comprising respectively the plurality of memory layers, and
   the address mapping controller translates the input address to an address corresponding to another memory tile, which is different from a memory tile comprising the bad region.

10. The resistive memory device of claim 1, wherein information on the bad region is provided to an external controller.

11. The resistive memory device of claim 1, wherein the bad region management unit detects whether the bad cell occurs, or where the first memory layer is located, based on the amount of current flowing through at least one memory cell from among the plurality of memory cells.

12. The resistive memory device of claim 1, wherein each of the plurality of memory layers shares one selected from the plurality of first lines and the plurality of second lines with adjacent memory layers.

13. The resistive memory device of claim 1, wherein the memory cell comprises a variable resistor and a selection device, and the selection device comprises a bidirectional diode.

14. An operating method executed by control logic of a resistive memory device comprising a memory cell array in which a plurality of memory layers is stacked, the method comprising:
   detecting that a failure occurs in a memory cell;
   determining a type of the failure based on the amount of current flowing in the memory cell; and
   performing a bad region management based on the type of the failure.

15. The method of claim 14, wherein the determining of the type of the failure comprises determining that the failure is a first type failure if the amount of current is equal to or greater than a reference value and that the failure is a second type failure if the amount of current is less than the reference value.

16. The method of claim 15, wherein the performing of the bad region management comprises defining as a bad region a memory layer comprising the memory cell, and at least one memory layer that is adjacent to the memory layer, when the failure is the first type failure.

17. The method of claim 15, wherein the performing of the bad region management comprises defining as a bad region a memory layer comprising the memory cell, when the failure is the second type failure.

18. The method of claim 15, wherein the reference value is a greater amount of a current than the amount of current flowing in the memory cell when the memory cell is in a lowest resistance state.

19. A memory system comprising:
   a nonvolatile memory; and
   control logic that:
   detects a first-type failure of a first memory cell of the nonvolatile memory;
   identifies a first memory layer in which the first memory cell exists within the nonvolatile memory;
   identifies a second memory layer having a second memory cell that is addressed by a bit or word line that also addresses the first memory cell; and
   redirects a memory operation directed to a memory cell within the first or second memory layers to a memory cell of first and second substitute memory layers, respectively, that differ from the first and second memory layers, wherein:
   each of the first and second memory layers comprises memory cells that are addressed by a set of bit and word lines that are common to the first and second memory layers, and
   the first-type failure of the first memory cell is detected when a first predetermined reference current is determined to flow through the first memory cell.

20. The memory system of claim 19, wherein the first and second memory layers are disposed adjacent to each other in the nonvolatile memory.

21. The memory system of claim 19, further comprising:
remapping all memory cell addresses of the first and second memory layers to memory cell addresses of the first and second substitute memory layers, respectively, and
storing the remapping information in another nonvolatile memory.

22. The memory system of claim 19, further comprising:
detecting a second-type failure of a third memory cell when a second predetermined reference current, which is less than the first predetermined reference current, is determined to flow through the third memory cell;
identifying a third memory layer in which the third memory cell exists within the nonvolatile memory; and
redirecting a memory operation directed to a memory cell within the third memory layer to a memory cell of a third substitute memory layer that differs from the third memory layer.

* * * * *